(12) United States Patent
Kawashima et al.

(10) Patent No.: US 10,978,385 B2
(45) Date of Patent: Apr. 13, 2021

(54) SEMICONDUCTOR DEVICE AND MANUFACTURING METHOD THEREOF

(71) Applicant: Renesas Electronics Corporation, Tokyo (JP)

(72) Inventors: Yoshiyuki Kawashima, Tokyo (JP); Takashi Hashimoto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/655,606

(22) Filed: Oct. 17, 2019

(65) Prior Publication Data

US 2020/0051905 A1 Feb. 13, 2020

Related U.S. Application Data

(62) Division of application No. 15/904,346, filed on Feb. 24, 2018, now Pat. No. 10,490,496.

(30) Foreign Application Priority Data

Apr. 28, 2017 (JP) .................................. 2017-089300

(51) Int. Cl.
*H01L 29/66* (2006.01)
*H01L 23/522* (2006.01)
(Continued)

(52) U.S. Cl.
CPC ........ *H01L 23/5223* (2013.01); *H01L 21/762* (2013.01); *H01L 21/76877* (2013.01);
(Continued)

(58) Field of Classification Search
CPC .......................... H01L 29/66181; H01L 28/40
See application file for complete search history.

(56) References Cited

U.S. PATENT DOCUMENTS 7,112,847 B1 9/2006 Yu et al.
8,994,145 B2 3/2015 Sato
(Continued)

FOREIGN PATENT DOCUMENTS

JP H 10-4146 1/1998
JP 2009-010281 A 1/2009

OTHER PUBLICATIONS

Gaitan et al., "Small Signal Modeling of the MOSOS Capacitor," National Institute of Standards and Technology, Semiconductor Electronics Division, Gaithersburg, MD., Oct. 3, 1989, pp. 48-49.

(Continued)

*Primary Examiner* — Mark V Prenty
(74) *Attorney, Agent, or Firm* — SGPatents PLLC

(57) ABSTRACT

This invention is to improve a performance of a semiconductor device. The semiconductor device includes a semiconductor substrate, a p-type well region formed in the semiconductor substrate, a first insulating layer formed over the p-type well region, a semiconductor layer formed over the first insulating layer, a second insulating layer formed over the semiconductor layer, and a conductor layer formed over the second insulating layer. A first capacitive element is comprised of the semiconductor layer, the second insulating layer, and the conductor layer, while a second capacitive element is comprised of the p-type well region, the first insulating layer, and the semiconductor layer, in which each of the semiconductor substrate and the semiconductor layer includes a single crystal silicon layer.

7 Claims, 18 Drawing Sheets

(51) Int. Cl.
| | |
|---|---|
| *H01L 27/11517* | (2017.01) |
| *H01L 21/768* | (2006.01) |
| *H01L 23/532* | (2006.01) |
| *H01L 21/762* | (2006.01) |
| *H01L 49/02* | (2006.01) |
| *H01L 27/11573* | (2017.01) |
| *H01L 29/94* | (2006.01) |
| *H01L 27/12* | (2006.01) |
| *H01L 27/08* | (2006.01) |
| *H01L 27/06* | (2006.01) |

(52) U.S. Cl.
CPC .. *H01L 23/53295* (2013.01); *H01L 27/11517* (2013.01); *H01L 27/11573* (2013.01); *H01L 27/1207* (2013.01); *H01L 28/40* (2013.01); *H01L 28/60* (2013.01); *H01L 29/94* (2013.01); *H01L 27/0629* (2013.01); *H01L 27/0805* (2013.01)

(56) References Cited

U.S. PATENT DOCUMENTS

| | | | |
|---|---|---|---|
| 10,490,496 B2* | 11/2019 | Kawashima | ............ H01L 29/94 |
| 2011/0175152 A1 | 7/2011 | Booth, Jr. et al. | |
| 2015/0270393 A1 | 9/2015 | Kumar | |

OTHER PUBLICATIONS

Flandre et al., "ac capacitance and conductance measurements of two-terminal metal-oxide-semiconductor-oxide-semiconductor capacitors on silicon-on-insulator substrates," Journal of Applied Physics 70, No. 9, Nov. 1, 1991, pp. 5111-5113.

Extended Search Report dated Mar. 20, 2019, in European Patent Application No. 18159566.1.

Office Action dated Oct. 13, 2020, in Japanese Patent Application No. 2017-089300.

* cited by examiner

SEMICONDUCTOR DEVICE AND MANUFACTURING METHOD THEREOF

CROSS-REFERENCE TO RELATED APPLICATIONS

The disclosure of Japanese Patent Application No. 2017-089300 filed on Apr. 28, 2017 including the specification, drawings and abstract is incorporated herein by reference in its entirety.

BACKGROUND

The present invention relates to a semiconductor device and a manufacturing method thereof, and can be suitably used, for example, for a semiconductor device having a capacitive element and a manufacturing method thereof.

Japanese Unexamined Patent Application Publication No. 2009-10281 (Patent Document 1) discloses a semiconductor device including both a nonvolatile memory cell having a control electrode and a memory gate electrode and a capacitive element. And, a configuration is disclosed in which the control electrode and the lower electrode of the capacitive element are formed by a polysilicon layer which is the first layer, and the memory gate electrode and the upper electrode of the capacitive element are formed by a polysilicon layer which is the second layer.

RELATED ART DOCUMENT

Patent Document

[Patent Document 1] Japanese Unexamined Patent Application Publication No. 2009-10281

SUMMARY

The inventors of the present application are studying a semiconductor device in which a nonvolatile memory cell and a capacitive element are formed, over an SOI (Silicon On Insulator) substrate, by using a single-layer polysilicon layer. The SOI substrate has a three-layer structure in which, for example, a semiconductor layer including a single crystal silicon layer is formed over a silicon substrate via a buried insulating layer (silicon oxide layer or the like). The capacitive element is configured to include a semiconductor region formed in the semiconductor layer as a lower electrode, an insulating film formed over the semiconductor layer as a dielectric layer, and a conductor layer, which is formed of a polysilicon layer and over the dielectric layer, as an upper electrode.

In order to improve the performance of a semiconductor device (semiconductor chip), an increase in the capacitance value of a capacitive element is required, but if the occupied area of the capacitive element increases, there is the concern that the manufacturing cost of the semiconductor device may be increased and the manufacturing yield may be decreased. That is, it is required to improve the performance of a semiconductor device without an increase in the manufacturing cost of the semiconductor device and a decrease in the manufacturing yield.

Other problems and new characteristics will become clear from the description and accompanying drawings of the present specification.

According to one embodiment, a semiconductor device includes: a semiconductor substrate; a p-type well region formed in the semiconductor substrate; a first insulating layer formed over the p-type well region; a semiconductor layer formed over the first insulating layer; a second insulating layer formed over the semiconductor layer; and a conductor layer formed over the second insulating layer. A first capacitive element is comprised of the semiconductor layer, the second insulating layer, and the conductor layer, and a second capacitive element is comprised of the p-type well region, the first insulating layer, and the semiconductor layer, and each of the semiconductor substrate and the semiconductor layer includes a single crystal silicon layer.

According to the one embodiment, the performance of the semiconductor device can be improved.

DETAILED DESCRIPTION

Figure 1:
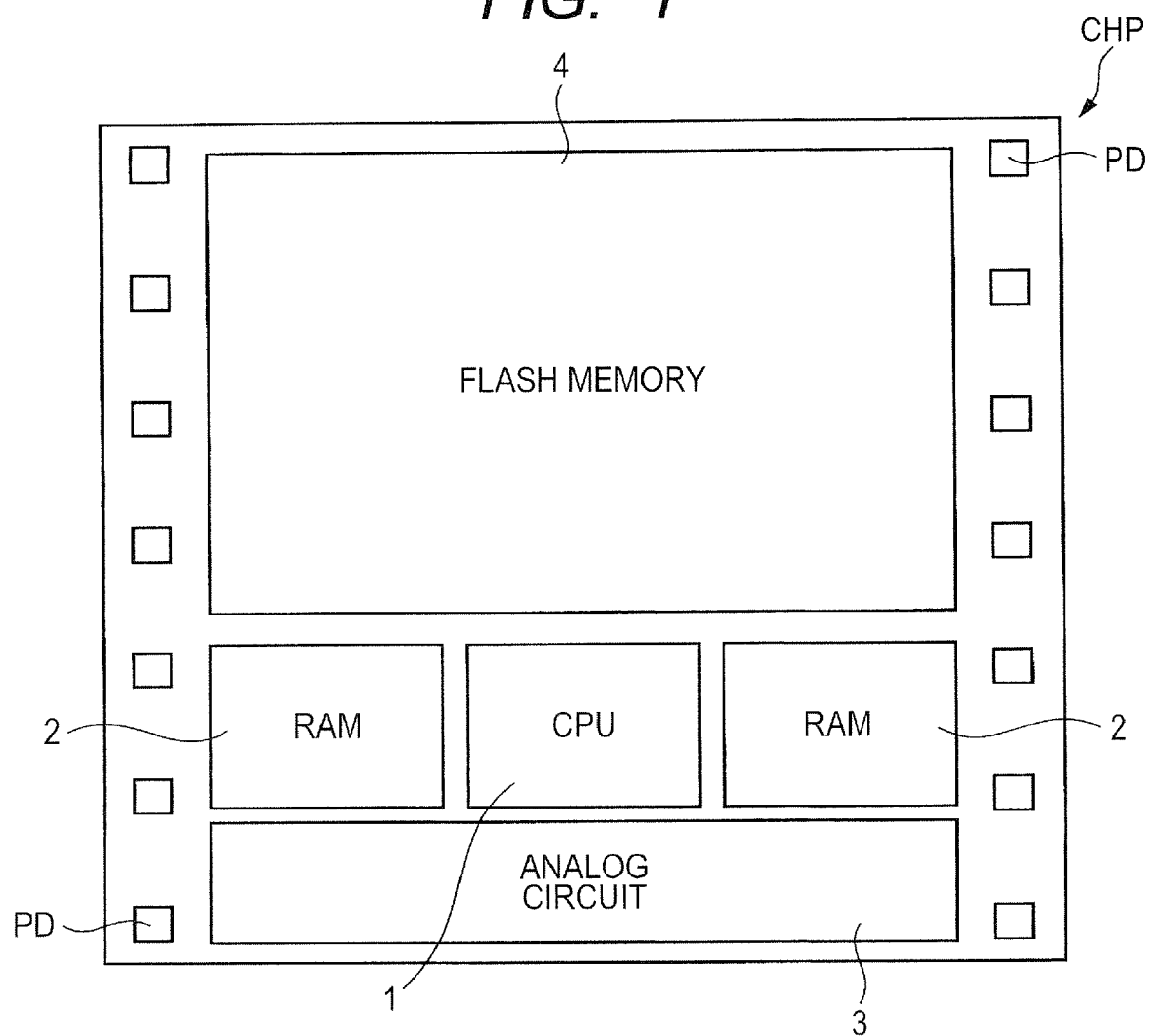
FIG. 1 is a plan view illustrating a configuration of a semiconductor chip in an embodiment.

When necessary for convenience in the following embodiments, description is given by dividing the embodiment into a plurality of sections or embodiments; however, unless expressly stated otherwise, they are not independent of one another, but one is related with part or the whole of another as a variation, a detail, supplementary description, etc.

When the numbers of elements, etc. (including numbers of pieces, numerical values, amounts, ranges, etc.) are referred to in the following embodiments, the numbers are not limited to the specific ones but may be more or less than the specific numbers, unless expressly stated otherwise or except when the numbers are obviously limited to the specific numbers in principle.

In the following embodiments, it is needless to say that a constituent element (including an element step, etc.) is not always essential, unless expressly stated otherwise or except when considered to be clearly essential in principle. Similarly, in the following embodiments, when the shapes and positional relations, etc., of the constituent elements, etc., are referred to, those substantially the same as or similar to the shapes, etc., should be included, unless expressly stated otherwise or except when considered to be clearly otherwise in principle. This also applies to the above numerical values and ranges.

Hereinafter, typical embodiments will be described in detail with reference to the accompanying drawings. In each view for explaining the embodiments, components having the same function will be denoted with the same reference numerals, and duplicative description thereof will be omitted. In the following embodiments, description of the same or similar parts will not be repeated in principle, unless particularly necessary.

In the views used in the embodiments, hatching may be omitted even in sectional views in order to make them easier to see.

Also, the fact that an element A is electrically coupled to an element B means the case where it is coupled via a conductor layer, and unless otherwise noted, capacitive coupling, in which an insulating layer is interposed between the element A and the element B, is not included.

Embodiment

A semiconductor device according to the present embodiment will be described with reference to the views. FIG. 1 is a view illustrating a configuration of a semiconductor chip CHP in the embodiment. FIG. 1 is a plan view illustrating the semiconductor chip CHP that forms, for example, a microcomputer, and illustrates a layout configuration of respective elements formed in the semiconductor chip CHP. In FIG. 1, the semiconductor chip CHP has a CPU (Central Processing Unit) 1, a RAM (Random Access Memory) 2, an analog circuit 3, and a flash memory 4. The semiconductor chip CHP further has a plurality of pad electrodes (external coupling terminals) PD that are input/output terminals with external devices.

The CPU (circuit) 1 is also called a central processing unit and corresponds to the heart of a computer or the like. The CPU 1 reads commands from a storage device to decode them, and performs various types of arithmetic operations and controls based on the commands, and high speed processing is required. Therefore, for a MISFET (Metal Insulator Semiconductor Field Effect Transistor) that forms the CPU 1, relatively high speed operation and low power consumption are required among the elements formed in the semiconductor chip CHP. That is, the MISFET is formed of a low breakdown voltage MISFET.

The RAM (circuit) 2 is a memory from which information that have been stored can be read at random, i.e., at any time or into which information to be stored can be newly written, and is also called a memory that can be read and written at any time. Herein, an SRAM (Static RAM) adopting a static circuit is used, and the SRAM is a random access memory that does not require memory holding operations. A MISFET that forms the RAM 2 is formed of a low breakdown voltage MISFET.

The analog circuit 3 is a circuit that handles signals of voltage and current that vary continuously in time, i.e., analog signals, and is comprised of, for example, an amplifier circuit, a conversion circuit, a modulation circuit, an oscillation circuit, a power supply circuit, and the like. Each of these analog circuits 3 is formed of a high breakdown voltage MISFET.

The flash memory 4 is a nonvolatile memory in which a write operation and an erase operation can be performed electrically. The memory cell of the flash memory 4 has a gate electrode, a charge storage part, a source region, and a drain region. Since a high voltage is used in a write operation or an erase operation in the memory cell, the flash memory 4 has a booster circuit and the memory cell is formed of a high breakdown voltage MISFET.

Capacitive elements are provided, for example, in the conversion circuit of the analog circuit 3 or the booster circuit of the flash memory 4, but the number of these capacitive elements is large and the occupied area of each capacitive element is large, which cause the area of a semiconductor chip to be increased. Therefore, a reduction in the occupied area of each capacitive element is effective to reduce the area of a semiconductor chip.

The present embodiment relates to a capacitive element to be used, for example, in the analog circuit 3 and the flash memory 4.

Figure 2:
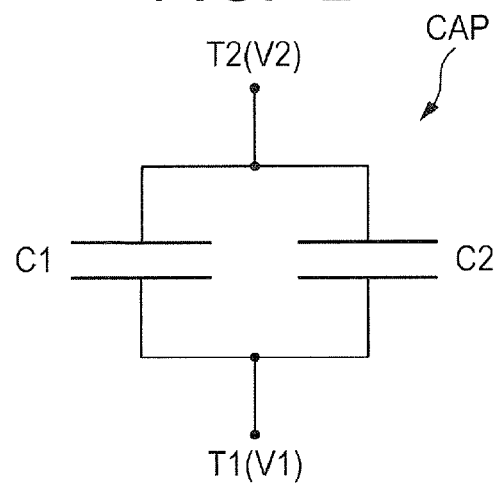
FIG. 2 is an equivalent circuit view of a capacitive element in the embodiment.
Figure 3:
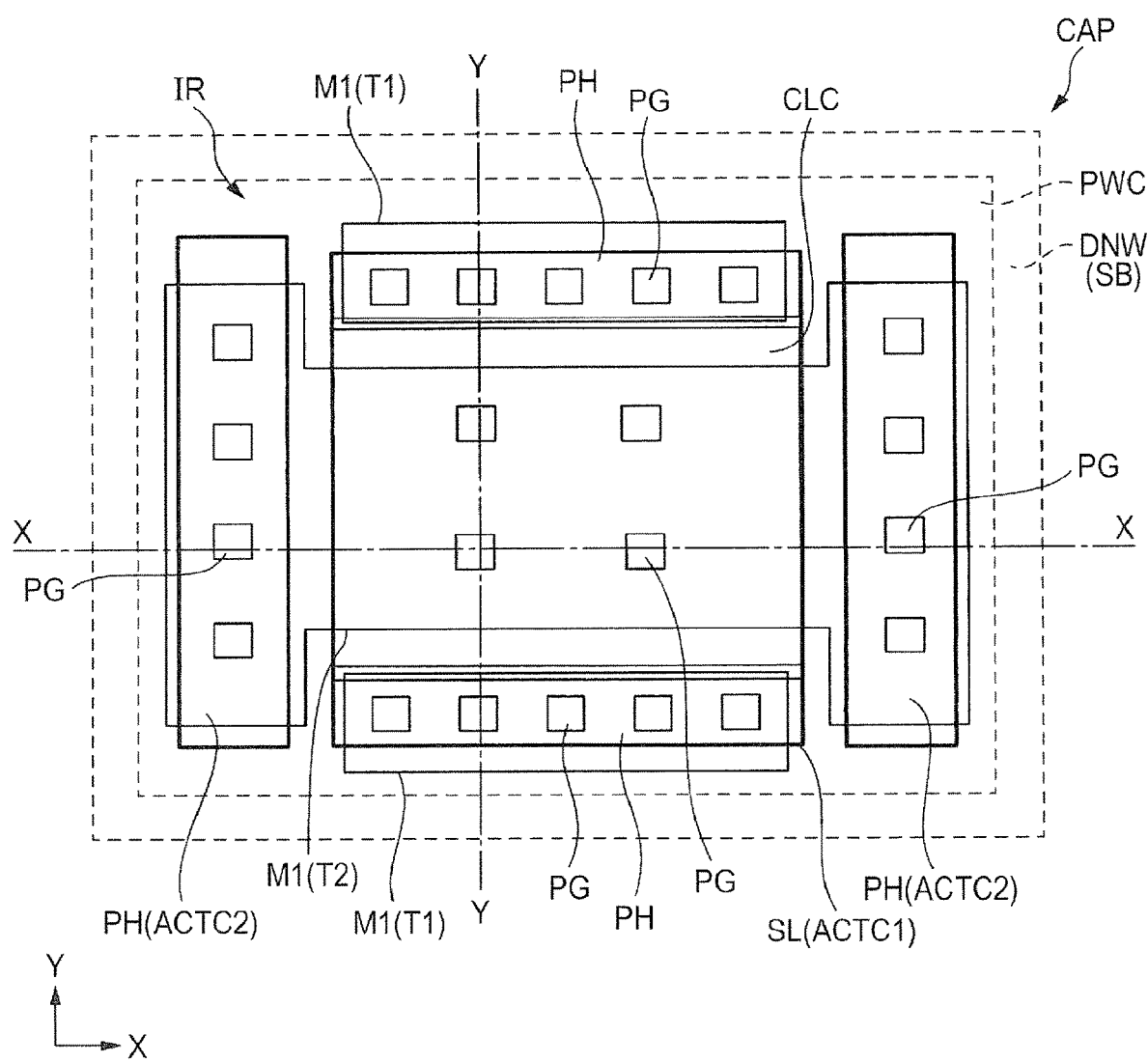
FIG. 3 is a plan view of a main part of the capacitive element in the embodiment.
Figure 4:
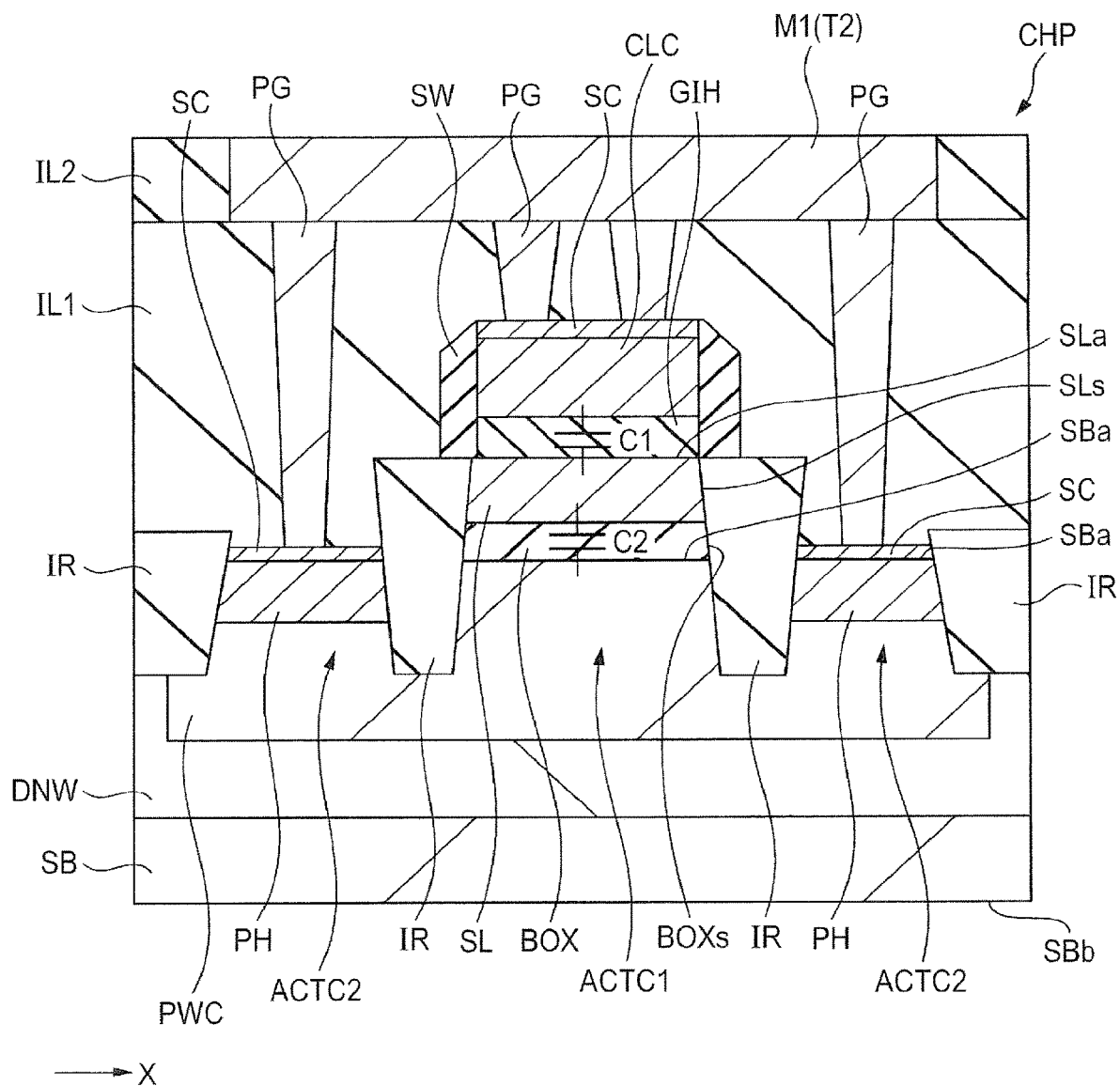
FIG. 4 is a sectional view of the main part taken along Line X-X in FIG. 3.
Figure 5:
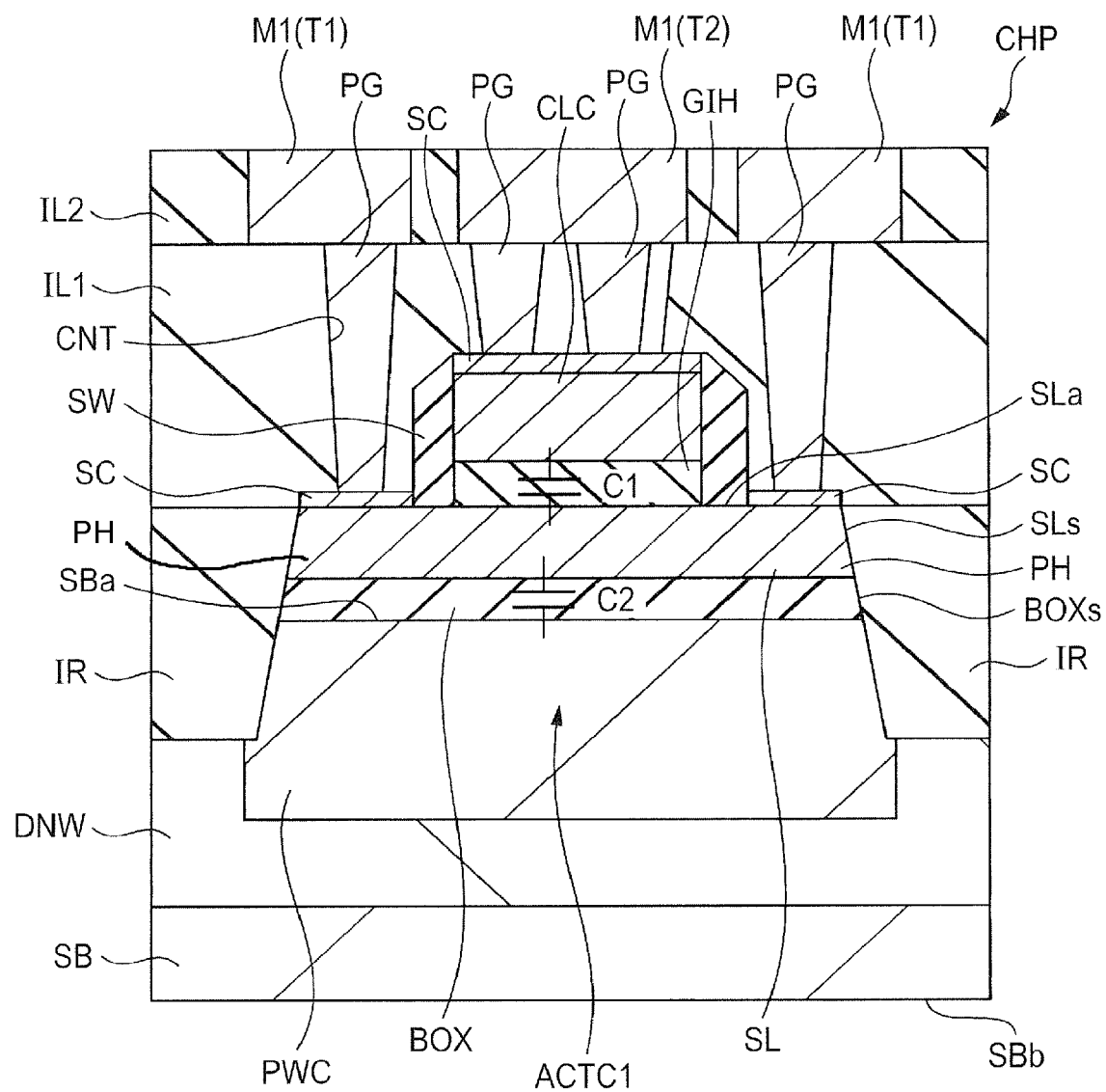
FIG. 5 is a sectional view of the main part taken along Line Y-Y in FIG. 3.

FIG. 2 is an equivalent circuit view of a capacitive element in the present embodiment. FIG. 3 is a plan view of a main part of the capacitive element in the embodiment. FIG. 4 is a sectional view of the main part taken along Line X-X in FIG. 3. FIG. 5 is a sectional view of the main part taken along Line Y-Y in FIG. 3.

As illustrated in FIG. 2, a capacitive element CAP has a configuration in which capacitive elements C1 and C2 are coupled together in parallel. Each of the capacitive elements C1 and C2 is coupled to one terminal T1 and the other terminal T2, and a potential V1 is applied to the terminal T1 and a potential V2 to the terminal T2. For example, the potential V1 is the ground potential and the potential V2 is an operation power supply potential.

The structure of the capacitive element CAP will be described with reference to FIGS. 3 to 5. The capacitive element CAP is formed, for example, in an n-type well region (n-type semiconductor region) DNW formed in a semiconductor substrate SB, as illustrated in FIGS. 3 to 5. The semiconductor substrate SB includes a substrate including p-type single crystal silicon.

As illustrated in FIG. 4, the capacitive element CAP has a structure in which the capacitive element C1 is stacked over the capacitive element C2. The capacitive element C1 includes a semiconductor layer (SOI layer) SL, an insulating layer GIH arranged over the semiconductor layer SL, and a conductor layer CLC arranged over the insulating layer GIH. The capacitive element C2 includes a p-type well region (p-type semiconductor region) PWC, an insulating layer (buried insulating layer) BOX arranged over the p-type well region PWC, and the semiconductor layer SL arranged over the insulating layer BOX. The semiconductor layer SL serves as a common electrode for the capacitive elements C1 and C2.

Any potential can be applied, independently of the potential of the semiconductor substrate SB, to the p-type well region PWC by interposing the n-type well region DNW between the semiconductor substrate SB and the p-type well region PWC that will be part of the capacitive element CAP.

The p-type well region PWC, which is one electrode of the capacitive element C2, is formed on the side of a main surface SBa of the semiconductor substrate SB, and active regions ACTC1 and ACTC2, the peripheries of which are surrounded by an element isolation layer (element isolation region) IR, are formed in the p-type well region PWC. In other words, the p-type well region PWC is formed to include the active regions ACTC1 and ACTC2, as illustrated in FIG. 3. Also, the p-type well region PWC is formed to be deeper than the element isolation layer IR and to straddle the active regions ACTC1 and ACTC2, as illustrated in FIG. 4.

As illustrated in FIGS. 3 and 4, the active region ACTC1 is sandwiched by two active regions ACTC2, and the capacitive elements C1 and C2 are formed in the active region ACTC1. The active region ACTC2 is a terminal coupling part of the p-type well region PWC. In FIG. 3, the active regions ACTC1 and ACTC2 are indicated by thick lines, and the insides of the thick lines (regions surrounded by the thick lines) are the active regions and the outside thereof (region other than the regions surrounded by the thick lines) is the element isolation layer (element isolation region) IR. The periphery of each of the active regions ACTC1 and ACTC2 is surrounded by the element isolation layer IR. In the active region ACTC1, the semiconductor layer SL and the insulating layer BOX are formed, but they are not formed in the two active regions ACTC2. In each of the two active regions ACTC2, a p-type semiconductor region (p-type high-concentration semiconductor region) PH is formed in the main surface SBa of the semiconductor substrate SB. Further, a silicide layer SC is formed over the p-type semiconductor region PH, and the silicide layer SC is electrically coupled to a wiring (metal wiring) Ml which is the terminal T2, via a plug electrode PG. However, the silicide layer SC is not illustrated in FIG. 3.

Herein, the active region means a region defined by the element isolation layer IR in the main surface SBa of the semiconductor substrate SB; however, in the case where the semiconductor layer SL is formed over the main surface SBa of the semiconductor substrate SB, like, for example, the active region ACTC1, a region defined by the element isolation layer IR in a main surface SLa of the semiconductor layer SL is also included.

As illustrated in FIG. 4, the dielectric layer of the capacitive element C2 is comprised of the insulating layer BOX. This insulating layer BOX is formed over the p-type well region PWC, in other words, over the main surface SBa of the semiconductor substrate SB. In addition, the periphery (entire periphery) of the insulating layer BOX is surrounded by the element isolation layer IR, and a side wall BOXs of the insulating layer BOX is in contact with the element isolation layer IR. The insulating layer BOX includes, for example, a silicon oxide layer and has a thickness of approximately 10 to 30 nm.

The semiconductor layer SL, the other electrode of the capacitive element C2, is formed over the insulating layer BOX and the periphery (entire periphery) thereof is surrounded by the element isolation layer IR. A side wall SLs of the semiconductor layer SL is in contact with the element isolation layer IR. The semiconductor layer SL is a p-type single crystal silicon layer into which p-type impurities have been introduced, and has a thickness of, for example, approximately 5 to 25 nm. The semiconductor layer SL is a p-type semiconductor layer.

The semiconductor layer SL, the other electrode of the capacitive element C2, is also one electrode of the capacitive element C1. The dielectric layer of the capacitive element C1 is comprised of the insulating layer GIH. The insulating layer GIH includes, for example, a silicon oxide layer and has a thickness of approximately 5 to 15 nm.

The conductor layer CLC, the other electrode of the capacitive element C1, is formed over the insulating layer GIH. The conductor layer CLC includes, for example, a polysilicon layer into which p-type impurities have been introduced, and has a thickness of approximately 30 to 200 nm. The silicide layer SC is formed over the main surface (surface on the upper side in FIG. 4) of the p-type conductor layer CLC, and the conductor layer CLC is electrically coupled to the wiring Ml which is the terminal T2, via the silicide layer SC and the plug electrode PG.

As illustrated in FIG. 4, the semiconductor layer SL, the insulating layer GIH, and the conductor layer CLC have widths substantially equal to each other in the X direction, and each of the insulating layer GIH and the conductor layer CLC covers the entire region of the main surface SLa of the semiconductor layer SL in the X direction.

A sidewall insulating layer (sidewall spacer) SW is formed over the side walls of the insulating layer GIH and the conductor layer CLC. The sidewall insulating layer SW includes an insulating layer, such as a silicon oxide layer, a silicon nitride layer, or a laminated film of a silicon oxide layer and a silicon nitride layer, and reduces a leakage current between the conductor layer CLC and the semiconductor layer SL. Alternatively, a structure may be adopted in which the width of the conductor layer CLC (and the insulating layer GIH) is made larger than that of the semiconductor layer SL in the X direction, so that the conductor layer CLC extends (rides) over the element isolation layers IR positioned on both sides of the semiconductor layer SL. By adopting such a structure, a leakage current between the conductor layer CLC and the semiconductor layer SL can be further reduced. That is, even if the side wall of the insulating layer GIH is recessed inward with respect to the side wall of the conductor layer CLC (referred to as "undercut"), a leakage current between the conductor layer CLC and the semiconductor layer SL can be further reduced by adopting the above structure.

As illustrated in FIG. 5, the insulating layer GIH and the conductor layer CLC have widths equal to each other in the Y direction, the widths thereof being smaller than that of the semiconductor layer SL. The semiconductor layer SL has both a covered region covered with the insulating layer GIH and the conductor layer CLC and an exposed region exposed from the insulating layer GIH, the conductor layer CLC, and the sidewall insulating layer SW. The covered region serves as a capacitive part of the capacitive element C1, while the exposed region serves as a terminal coupling part of the semiconductor layer SL. That is, in the exposed region, the p-type semiconductor region PH is formed in the semiconductor layer SL. Further, the silicide layer SC is formed over the p-type semiconductor region PH, and the silicide layer SC is coupled to the wiring (metal wiring) M1 which is the terminal T1, via the plug electrode PG.

Since the side walls of the insulating layer GIH and the conductor layer CLC are covered with the sidewall insulating film SW in the Y direction, a leakage current between the semiconductor layer SL and the conductor layer CLC can be reduced.

The semiconductor device according to the present embodiment has the following characteristics.

The capacitive element CAP has a structure in which the capacitive element C1 is stacked over the capacitive element C2 and the capacitive element C1 includes the semiconductor layer (SOI layer) SL, the insulating layer GIH arranged over the semiconductor layer SL, and the conductor layer CLC arranged over the insulating layer GIH. The capacitive element C2 includes the p-type well region (p-type semiconductor region) PWC, the insulating layer (buried insulating layer) BOX arranged over the p-type well region PWC, and the semiconductor layer SL arranged over the insulating layer BOX. Further, the semiconductor layer SL serves as a common electrode for the capacitive elements C1 and C2.

With such a configuration, the capacitance value per unit area of the capacitive element CAP can be improved without an increase in the manufacturing cost of a semiconductor device and a decrease in the manufacturing yield thereof, whereby the performance of the semiconductor device can be improved.

Further, by surrounding the side walls of the insulating layer BOX and the semiconductor layer SL, which form the capacitive element C2, with the element isolation layer IR in contact with the side walls thereof, a leakage current between the p-type well region PWC and the semiconductor layer SL of the capacitive element C2 can be reduced.

Furthermore, by forming the sidewall insulating film SW over the side walls of the insulating layer GIH and the conductor layer CLC that form the capacitive element C1, a leakage current between the conductor layer CLC and the semiconductor layer SL of the capacitive element C1 can be reduced.

Figure 17:
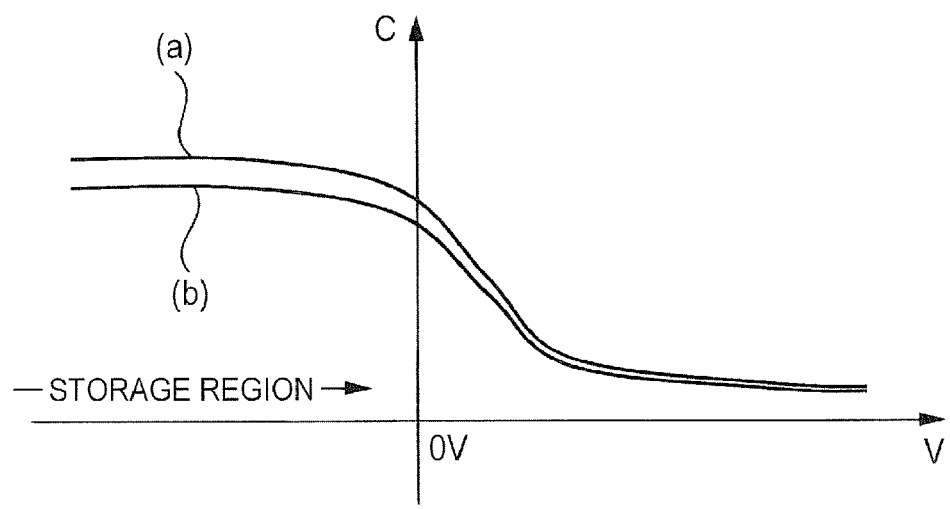
FIG. 17 is a view illustrating a C-V characteristic that is a relationship between the capacitance value of a capacitive element and a voltage.

Still furthermore, by forming the conductor layer CLC, which forms the capacitive element C1, with a polysilicon layer containing a high concentration of impurities, depletion of the conductor layer CLC can be prevented, and the capacitance characteristic of the capacitive element C1 can be improved. Herein, the high concentration means that it is higher, for example, than the impurity concentration of the semiconductor layer SL. Incidentally, FIG. 17 is a view illustrating a C-V characteristic that is a relationship between the capacitance value of a capacitive element and a voltage. In FIG. 17, the C-V characteristic in the case (a) where the impurity concentration of the conductor layer CLC is high and that in the case (b) where the impurity concentration of the conductor layer CLC is low are compared with each other, in the capacitive element C1 in which the conductor layer CLC is formed of a p-type polysilicon layer. In the case of (a), the capacitance value of a storage region (negative voltage side) can be improved more than in the case of (b).

Further, by similarly forming the p-type well region PWC, which forms the capacitive element C2, with a semiconductor layer (semiconductor region) containing a high concentration of impurities, depletion of the p-type well region PWC can be prevented, and the capacitance characteristic (e.g., C-V characteristic showing the relationship between a capacitance value and a voltage) of the capacitive element C2 can be improved. Herein, the high concentration means that it is higher, for example, than the impurity concentration of the semiconductor layer SL.

Figure 18:
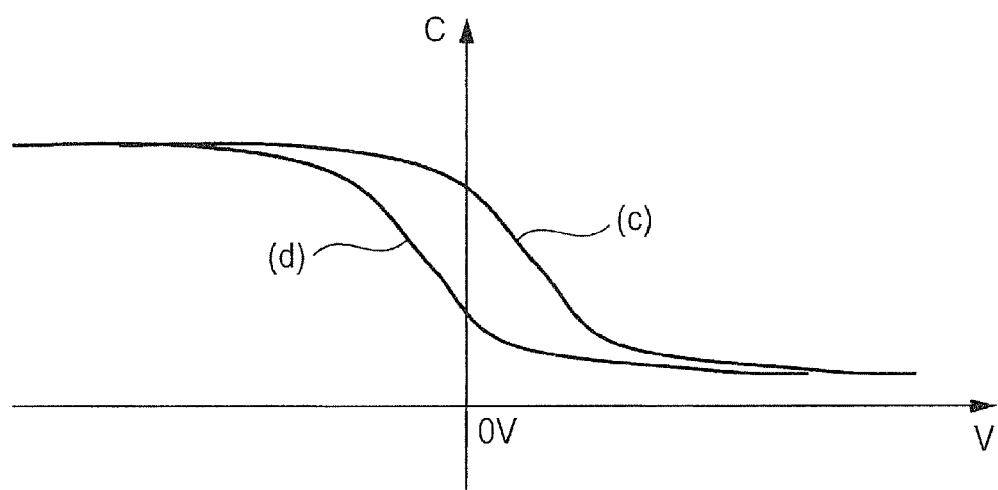
FIG. 18 is a view illustrating a C-V characteristic that is a relationship between the capacitance value of a capacitive element and a voltage.

Furthermore, by making the conductivity types of the semiconductor layer SL and the conductor layer CLC, which form the capacitive element C1, the same as each other (which are p-type in the above embodiment, but may be n-type), a flat band voltage between the semiconductor layer SL and the conductor layer CLC can be made small, so that the capacitance characteristic of the capacitive element C1 can be improved. Incidentally, FIG. 18 is a view illustrating a C-V characteristic that is a relationship between the capacitance value of a capacitive element and a voltage. In FIG. 18, the C-V characteristic in the case (c) where the conductor layer CLC and the semiconductor layer SL are of the same conductivity type and that in the case (d) where they are of different conductivity types are compared with each other in the capacitive element C1. In the case of (c), the variation of the capacitance value up to approximately 0 V can be made smaller on the negative voltage side than in the case of (d).

Still furthermore, by making the conductivity types of the semiconductor layer SL and the well region, which form the capacitive element C2, the same as each other (which are p-type in the above embodiment, but may be n-type), the same advantages as described above can be obtained.

<Manufacturing Method of Semiconductor Device>

Next, a manufacturing method of a semiconductor device according to the present embodiment will be described. The semiconductor device according to the embodiment includes the capacitive element CAP, a nonvolatile memory cell MONOS (Metal Oxide Nitride Oxide Silicon), a high breakdown voltage MISFET, and a low breakdown voltage MISFET. The high breakdown voltage MISFET and the low breakdown voltage MISFET have a CMOS configuration, but herein description will be given by taking a p-channel type high breakdown voltage MISFET and an n-channel type low breakdown voltage MISFET as an example. FIGS. 6 to 16 are sectional views of a main part during the manufacturing steps of the semiconductor device according to the embodiment. With reference to FIGS. 6 to 16, manufacturing methods of the capacitive element CAP, the nonvolatile memory cell MONOS, the p-channel type high breakdown voltage MISFET (HVP), and the n-channel type low breakdown voltage MISFET (LVN) will be described.

Figure 6:
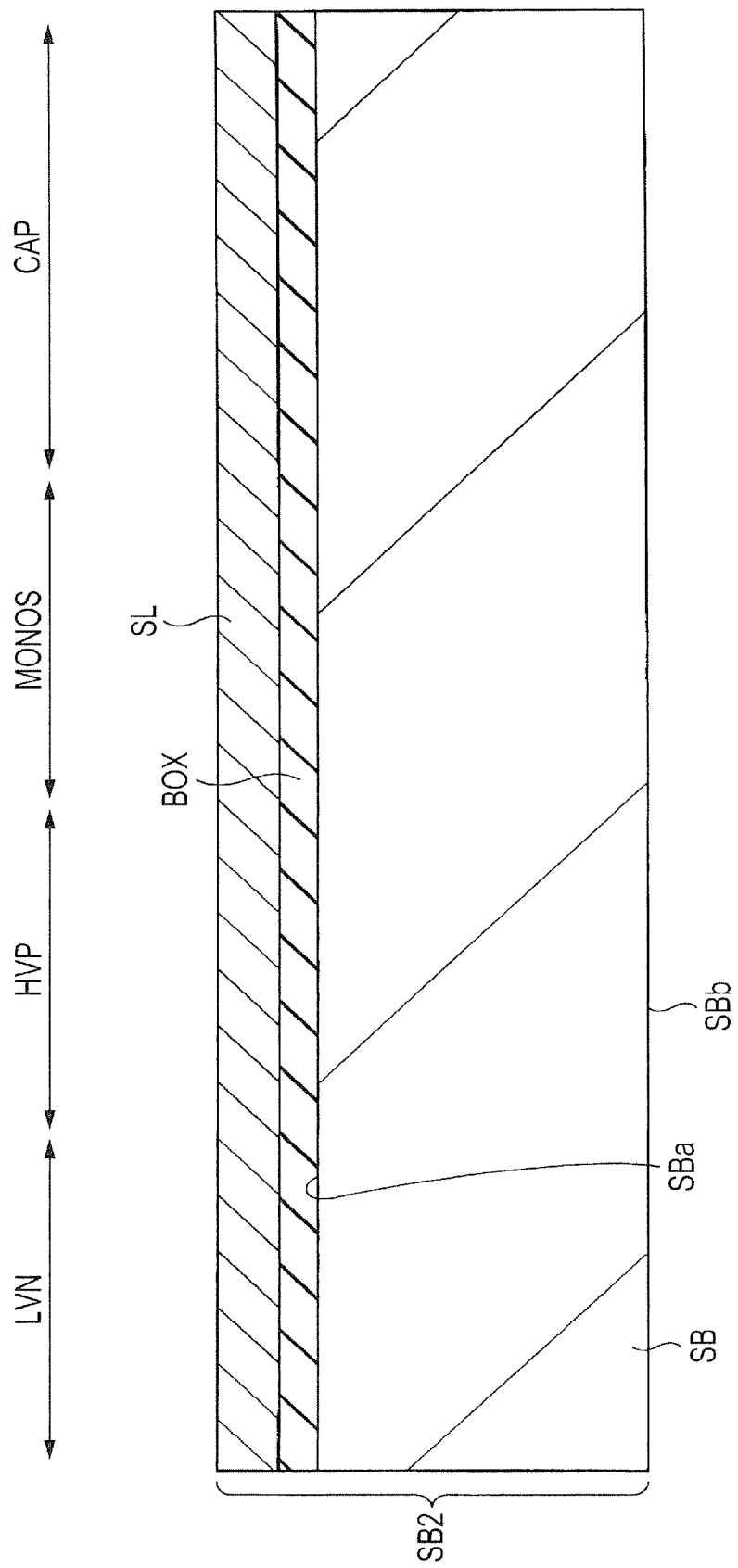
FIG. 6 is a sectional view of the main part during a manufacturing step of the semiconductor device according to the embodiment.

First, a substrate (SOI substrate) SB2 is provided as illustrated in FIG. 6. The substrate SB2 includes the semiconductor substrate SB, the insulating layer (buried insulating layer) BOX formed over the semiconductor substrate SB, and the semiconductor layer (SOI layer) SL formed over the insulating layer BOX. The insulating layer BOX is interposed between the semiconductor substrate SB and the semiconductor layer SL in the entire region of the main surface SBa of the semiconductor substrate SB. The semiconductor substrate SB is a layer including p-type single crystal silicon, and has the main surface SBa and a back surface SBb facing the main surface SBa. The insulating layer BOX includes, for example, a silicon oxide layer and has a thickness of approximately 10 to 30 nm. The semiconductor layer SL is a layer including single crystal silicon and has a thickness of approximately 5 to 25 nm.

Figure 7:
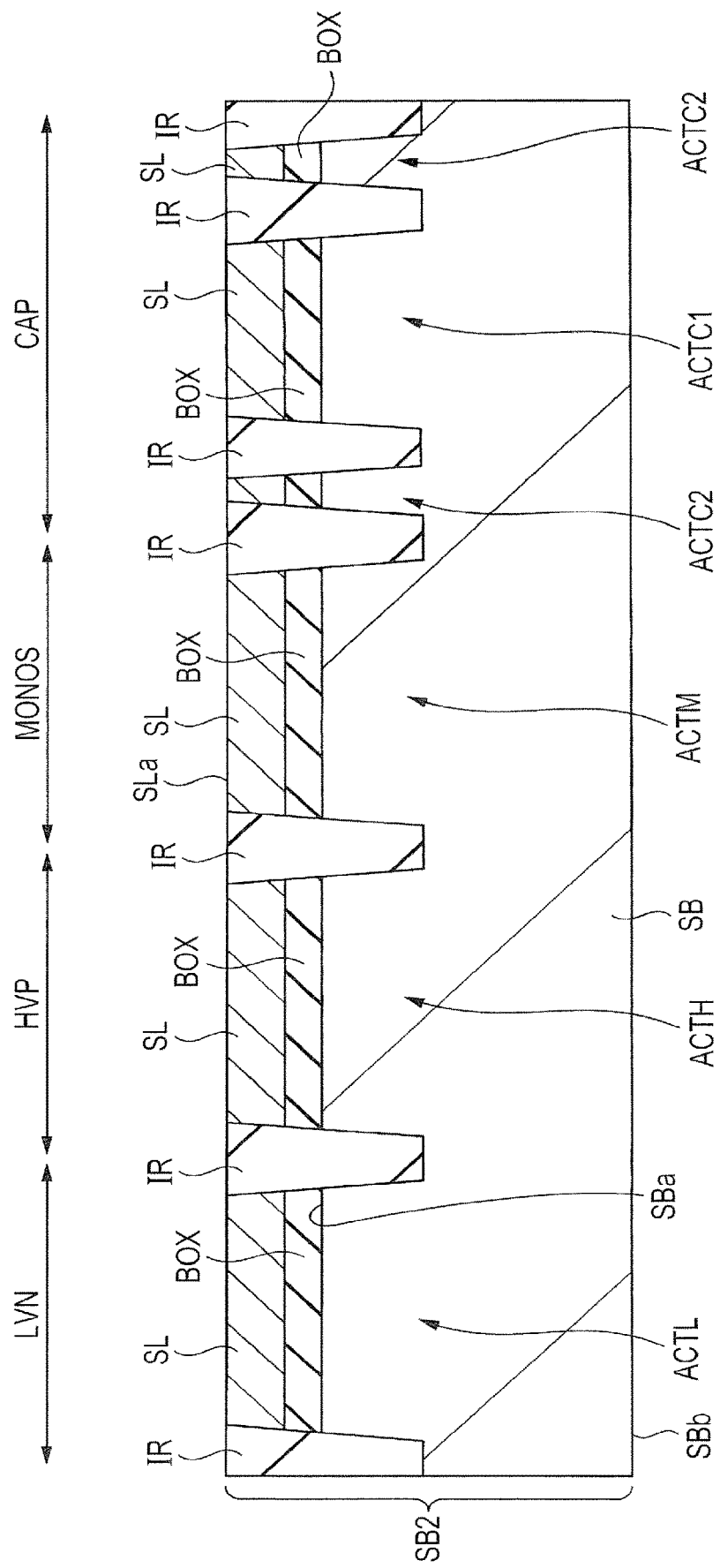
FIG. 7 is a sectional view of the main part during a manufacturing step of the semiconductor device according to the embodiment.

Next, the element isolation layer (element isolation region) IR is formed as illustrated in FIG. 7. An opening, which penetrates through the semiconductor layer SL and the insulating layer BOX to reach a desired depth (e.g., approximately 300 to 400 nm) from the main surface SBa of the semiconductor substrate SB, is formed in the substrate SB2, and the opening is filled with an insulating film such as, for example, a silicon oxide film or a laminated film of a silicon nitride layer and a silicon oxide layer. Next, the insulating film other than the opening portion is selectively removed by, for example, a CMP (Chemical Mechanical Polishing) process, whereby the element isolation layer IR is selectively formed in the opening. Thus, the active regions ACTC1 and ACTC2 are formed in a region where the capacitive element CAP is to be formed, an active region ACTM is formed in a region where the nonvolatile memory cell MONOS is to be formed, an active region ACTH is formed in a region where the high breakdown voltage MISFET (HVP) is to be formed, and an active region ACTL is formed in a region where the low breakdown voltage MISFET (LVN) is to be formed, respectively. Since the element isolation layer IR penetrates through the semiconductor layer SL and the insulating layer BOX to reach the inside of the semiconductor substrate SB, the active regions ACTC1, ACTC2, ACTM, ACTH, and ACTL are defined by the element isolation layer IR in the main surface SBa of the semiconductor substrate SB and the main surface SLa of the semiconductor layer SL. Herein, the opening does not reach the back surface SBb of the semiconductor substrate SB. In addition, it is shallower than the p-type well region PWC described with reference to FIG. 4.

Figure 8:
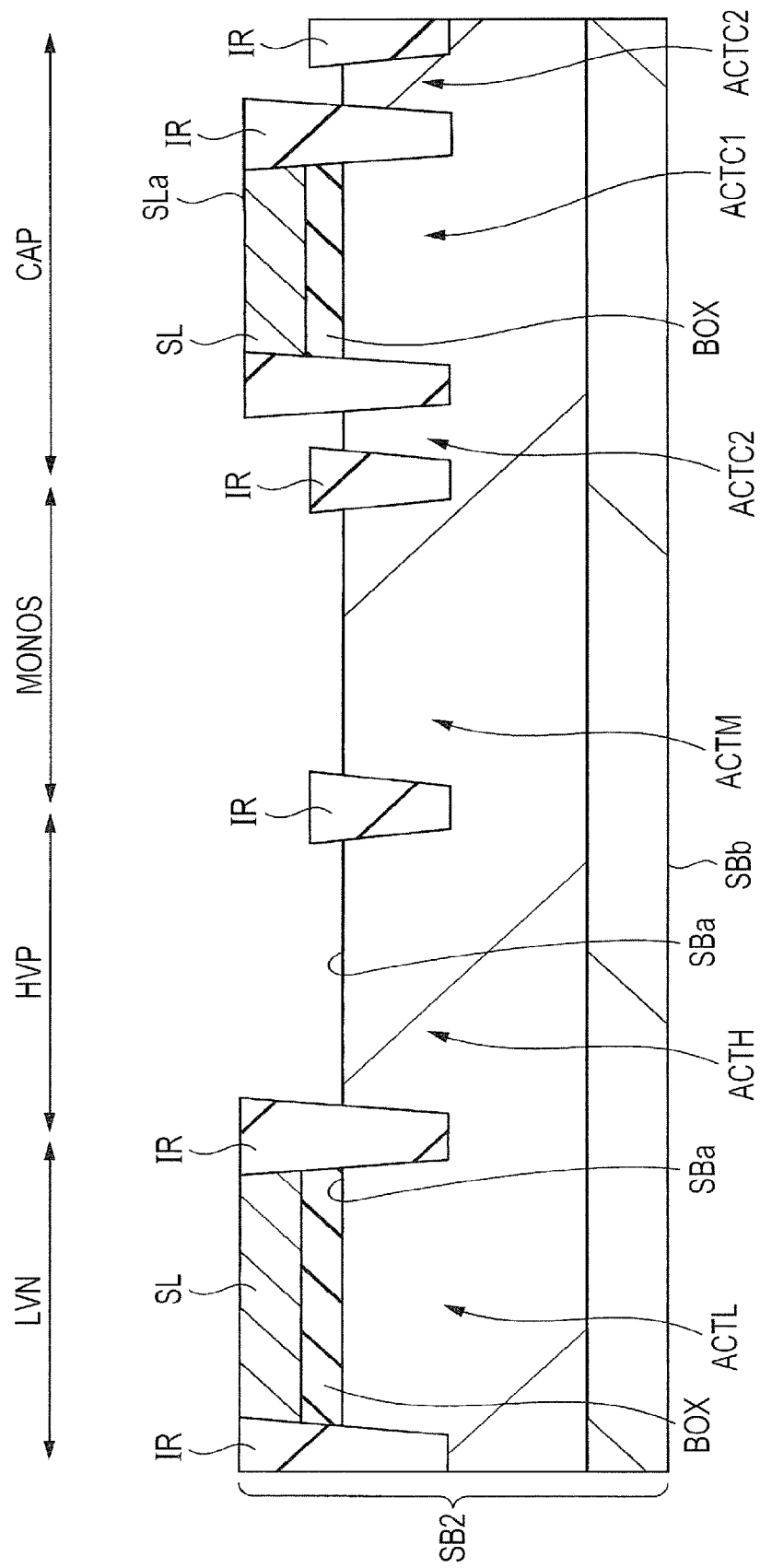
FIG. 8 is a sectional view of the main part during a manufacturing step of the semiconductor device according to the embodiment.

Next, the main surface SBa of the semiconductor substrate SB is exposed in the active regions ACTC2, ACTM, and ACTH by removing the semiconductor layer SL and the insulating layer BOX, as illustrated in FIG. 8. The semiconductor layer SL and the insulating layer BOX are left in the active regions ACTC1 and ACTL.

Figure 9:
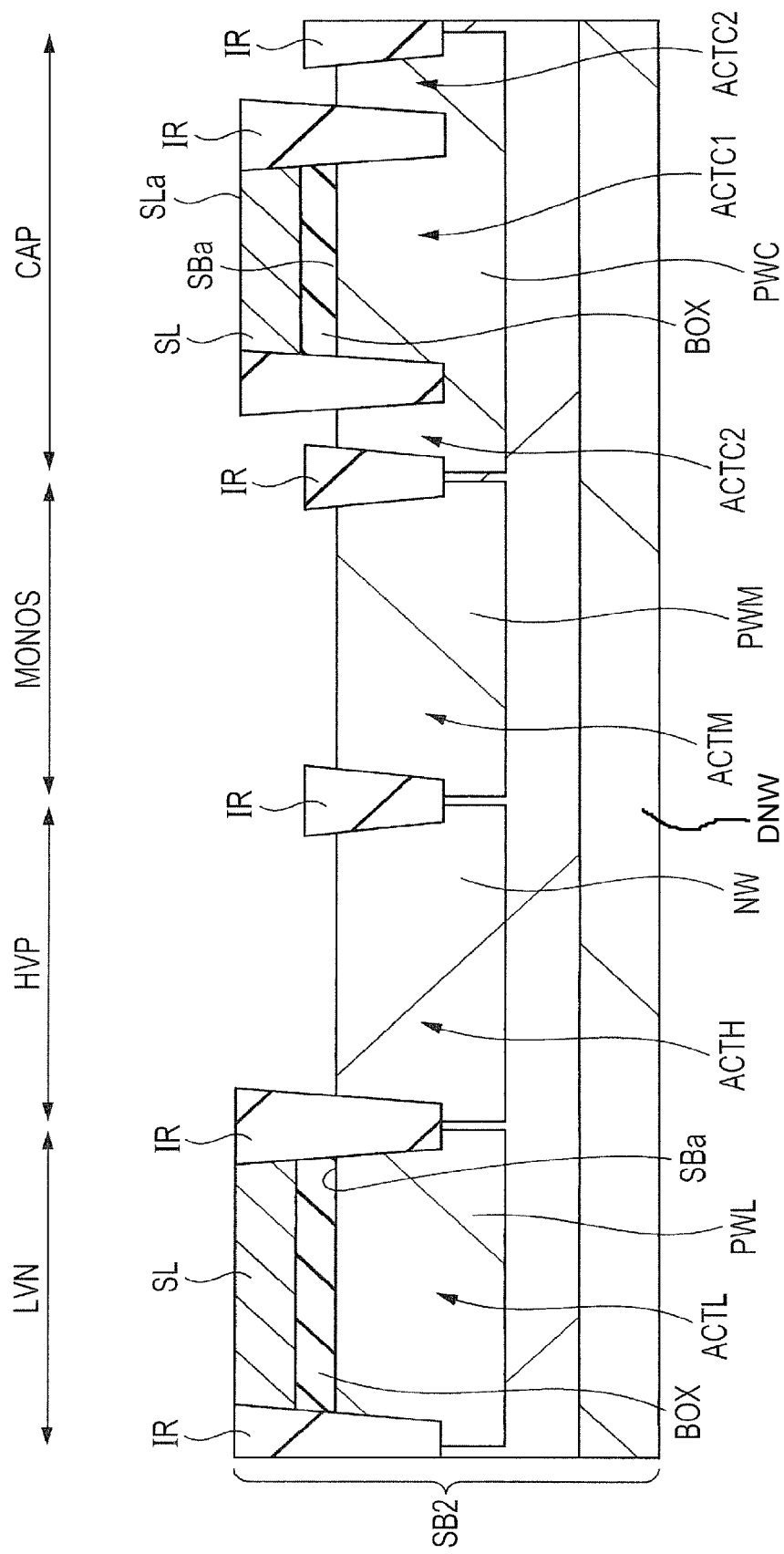
FIG. 9 is a sectional view of the main part during a manufacturing step of the semiconductor device according to the embodiment.

Next, the n-type well region (n-type semiconductor region) DNW, the n-type well region (n-type semiconductor region) NW, and the p-type well regions (p-type semiconductor regions) PWC, PWM and PWL are formed as illustrated in FIG. 9. First, the n-type well region DNW is formed by ion implanting n-type impurities, such as phosphorus (P) or arsenic (As), into the semiconductor substrate SB. Herein, the n-type well region DNW is formed to include the active regions ACTC1, ACTC2, ACTM, ACTH, and ACTL. In addition, the n-type well region DNW is deeper than the p-type well regions PWC, PWM, and PWL.

Next, the p-type well regions PWC, PWM, and PWL are formed by ion implanting p-type impurities, such as boron (B), into the semiconductor substrate SB. Herein, the p-type impurities are also implanted into the semiconductor layer SL in the active regions ACTC1 and ACTL, and hence the semiconductor layer SL becomes a p-type semiconductor layer (p-type semiconductor region). That is, the semiconductor layer SL, the other electrode of the capacitive element C2, is formed. In addition, the p-type well region PWC is formed to include the active regions ACTC1 and ACTC2, and serves as the one electrode of the capacitive element C2 (see FIG. 4). Herein, each of the p-type well regions PWC, PWM, and PWL may have an impurity concentration different from those of the others by being formed in an ion implantation step different from the other implantation steps. For example, the p-type well region PWM is formed to have a relatively low impurity concentration because it is a region where the high breakdown voltage MISFET (MONOS) is to be formed, but it is preferable that the p-type well region PWC is formed to have a relatively high impurity concentration for preventing depletion. Herein, the well formation step described with reference to FIG. 9 may be performed before the step of removing the semiconductor layer SL and the insulating layer BOX described with reference to FIG. 8.

Figure 10:
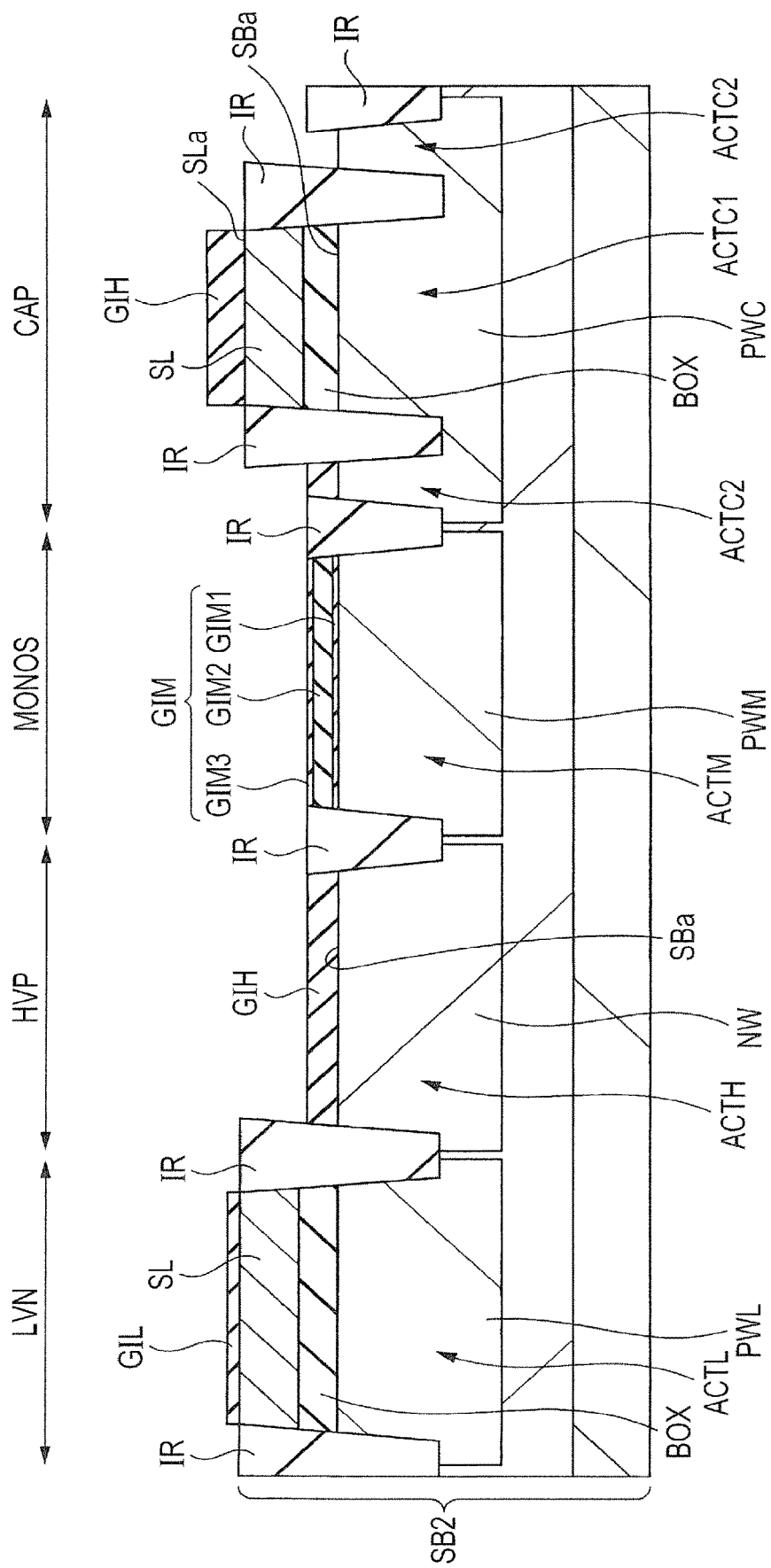
FIG. 10 is a sectional view of the main part during a manufacturing step of the semiconductor device according to the embodiment.

Next, the insulating layer GIH (gate insulating layer) is formed over both the semiconductor layer SL in the active region ACTC1 and the main surface SBa of the active region ACTH, the insulating layer GIM is formed over the main surface SBa of the active region ACTM, and the insulating layer GIL (gate insulating layer) is formed over the semiconductor layer SL in the active region ACTL, as illustrated in FIG. 10. The insulating layer GIH becomes the gate insulating layer of the high breakdown voltage MISFET (HVP), and serves as the dielectric layer of the capacitive element C1, as described with reference to FIG. 4. The reason why instead of the insulating film GIL, the insulating film GIH is used for the dielectric layer of the capacitive element C1 is to reduce a leakage current between the semiconductor layer SL and the conductor layer CLC of the capacitive element C1. The insulating layer GIH includes, for example, a silicon oxide layer, and the thickness thereof is approximately 5 to 15 nm. The insulating layer GIL becomes the gate insulating layer of the low breakdown voltage MISFET (LVN) and includes, for example, a silicon oxide layer, and the thickness thereof is approximately 1 to 4 nm. That is, the thickness of the insulating layer GIH is larger than that of the insulating layer GIL.

Next, the insulating layer (gate insulating layer) GIM has a laminated structure of insulating layers (gate insulating layers) GIM1, GIM2, and GIM3. The insulating layer GIM1 includes, for example, a silicon oxide layer and has a thickness of approximately 1 to 3 nm, the insulating layer GIM2 includes, for example, a silicon nitride layer and has a thickness of approximately 5 to 13 nm, and the insulating layer GIM3 includes, for example, a silicon oxide layer and has a thickness of approximately 2 to 4 nm. Incidentally, the insulating layer GIM2 is the charge retention layer of the nonvolatile memory cell MONOS. The insulating layers GIM1 and GIM3, which are arranged over and under the insulating layer GIM2, are layers for preventing leakage of the charges in the insulating layer GIM2. As illustrated in FIG. 10, the insulating layer GIM2 is formed over the insulating layer GIM1, and the insulating layer GIM3 is formed over the insulating layer GIM2.

Figure 11:
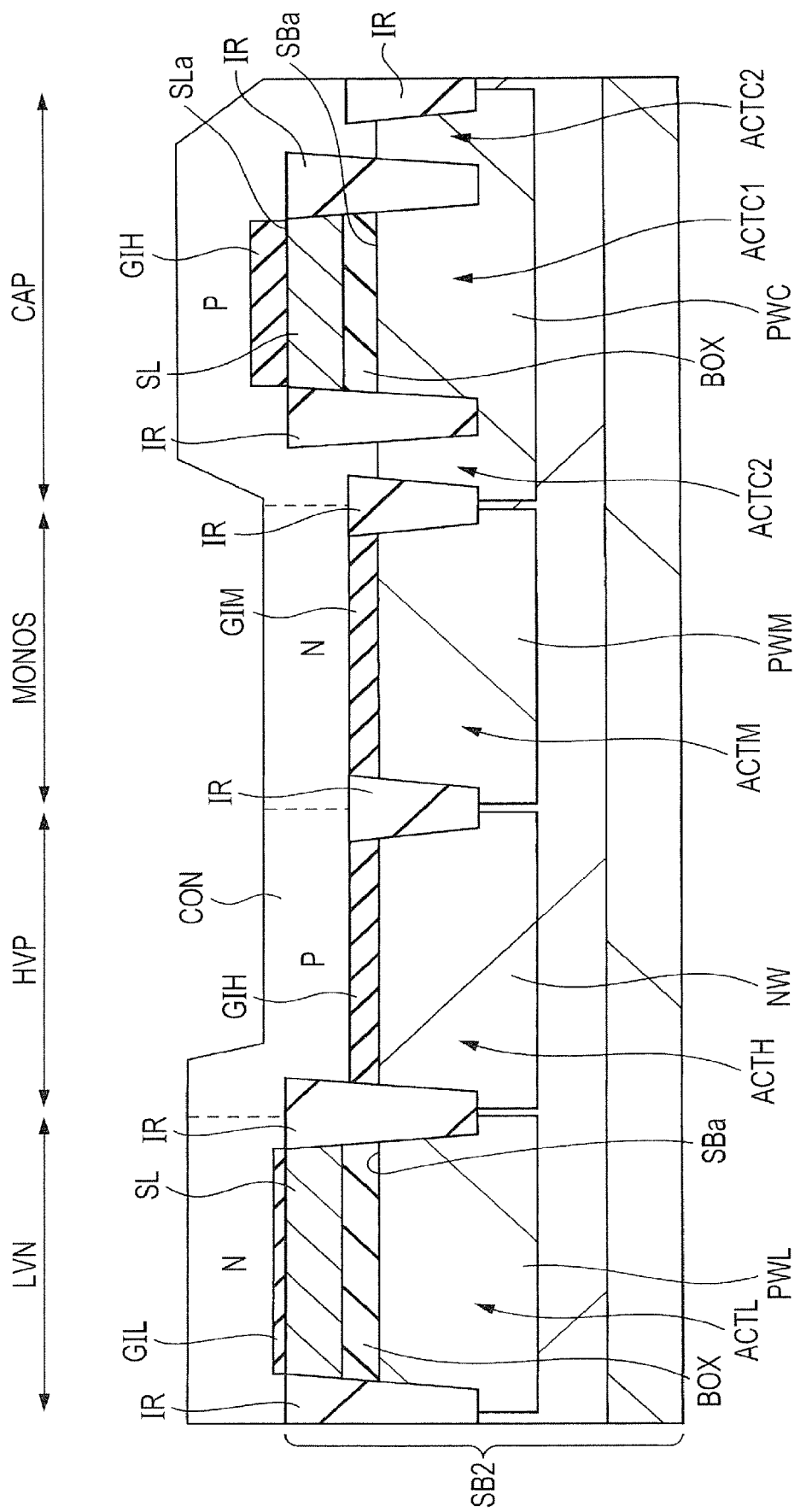
FIG. 11 is a sectional view of the main part during a manufacturing step of the semiconductor device according to the embodiment.

Next, a conductor layer CON including, for example, a polysilicon layer (silicon layer) is formed over the substrate SB2, as illustrated in FIG. 11. That is, the conductor layer CON is formed over the insulating films GIH, GIM, and GIL. The thickness of the conductor layer CON is set, for example, to approximately 30 to 200 nm. Next, a p-type conductor layer CON is formed by implanting p-type impurities, such as, for example, boron (B), into the conductor layer CON in a region where the capacitive element CAP and the high breakdown voltage MISFET (HVP) are to be formed; and an n-type conductor layer CON is formed by implanting n-type impurities, such as, for example, phosphorus (P) or arsenic (As), into a region where the nonvolatile memory cell MONOS and the low breakdown voltage MISFET (LVN) are to be formed.

Figure 12:
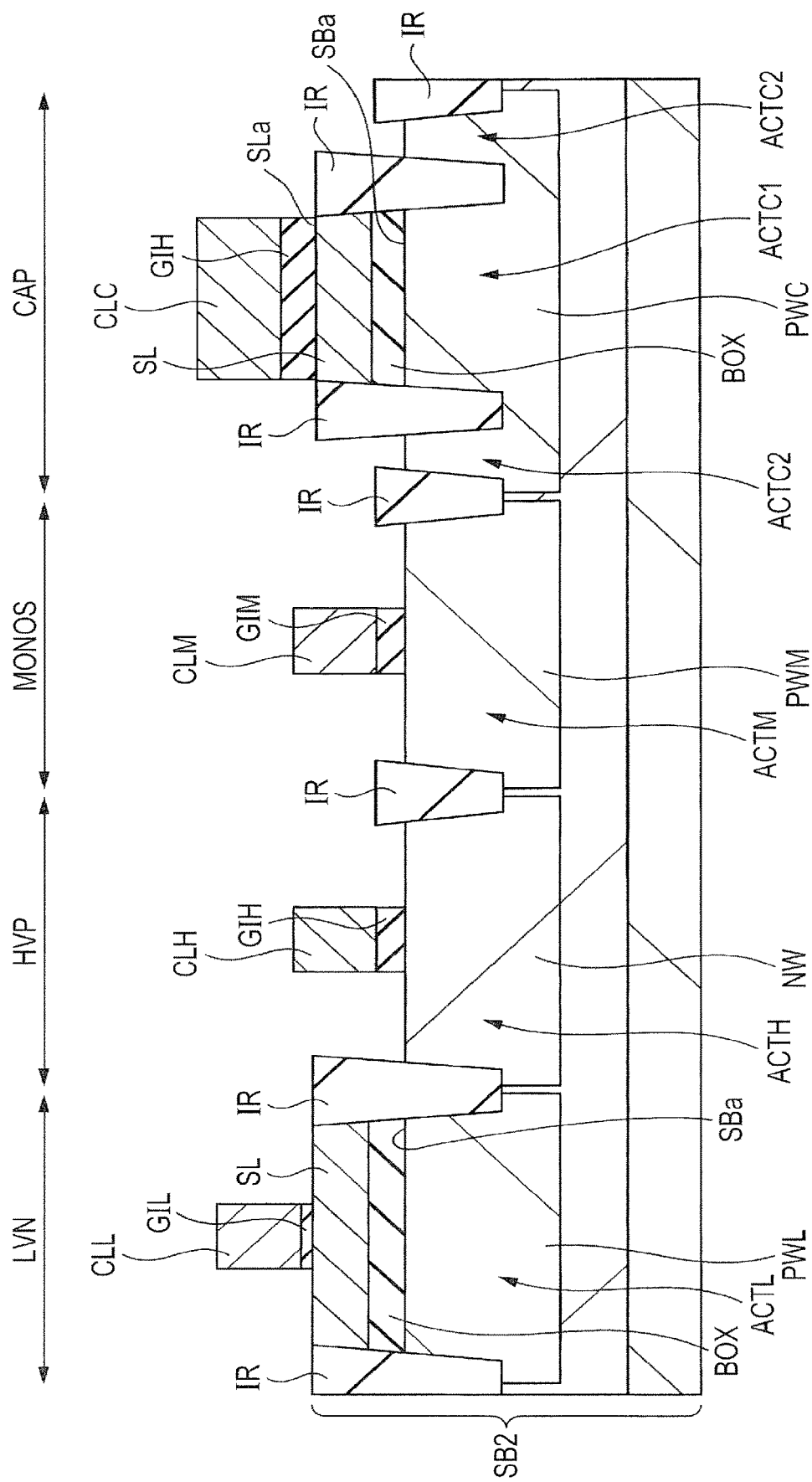
FIG. 12 is a sectional view of the main part during a manufacturing step of the semiconductor device according to the embodiment.

Next, the conductor layer CLC (see FIG. 4) that is the other electrode of the capacitive element C1, a conductor layer CLM that is the gate electrode of the nonvolatile memory cell MONOS, a conductor layer CLH that is the gate electrode of the high breakdown voltage MISFET (HVP), and a conductor layer CLL that is the gate electrode of the low breakdown voltage MISFET (LVN) are formed by patterning the conductor layer CON with the use of a photolithography technique and an etching technique, as illustrated in FIG. 12. As illustrated in FIG. 12, the width of the conductor layer CLC is equal to that of the active region ACTC1. In the step of etching the conductor layer CON with the use of a non-illustrated mask layer in the region where the capacitive element CAP is to be formed, the insulating layer GIH located thereunder is also etched by over-etching, but there is the possibility that at that time the above-mentioned "undercut" may be generated in the insulating layer GIH. If the "undercut" is generated, there is the concern that a leakage current between the conductor layer CLC and the semiconductor layer SL may be increased, and hence it is preferable to adopt a configuration in which both ends of the conductor layer CLC are caused to extend over the element isolation layer IR by making the width of the conductor layer CLC larger than that of the active region ACTC1.

Figure 13:
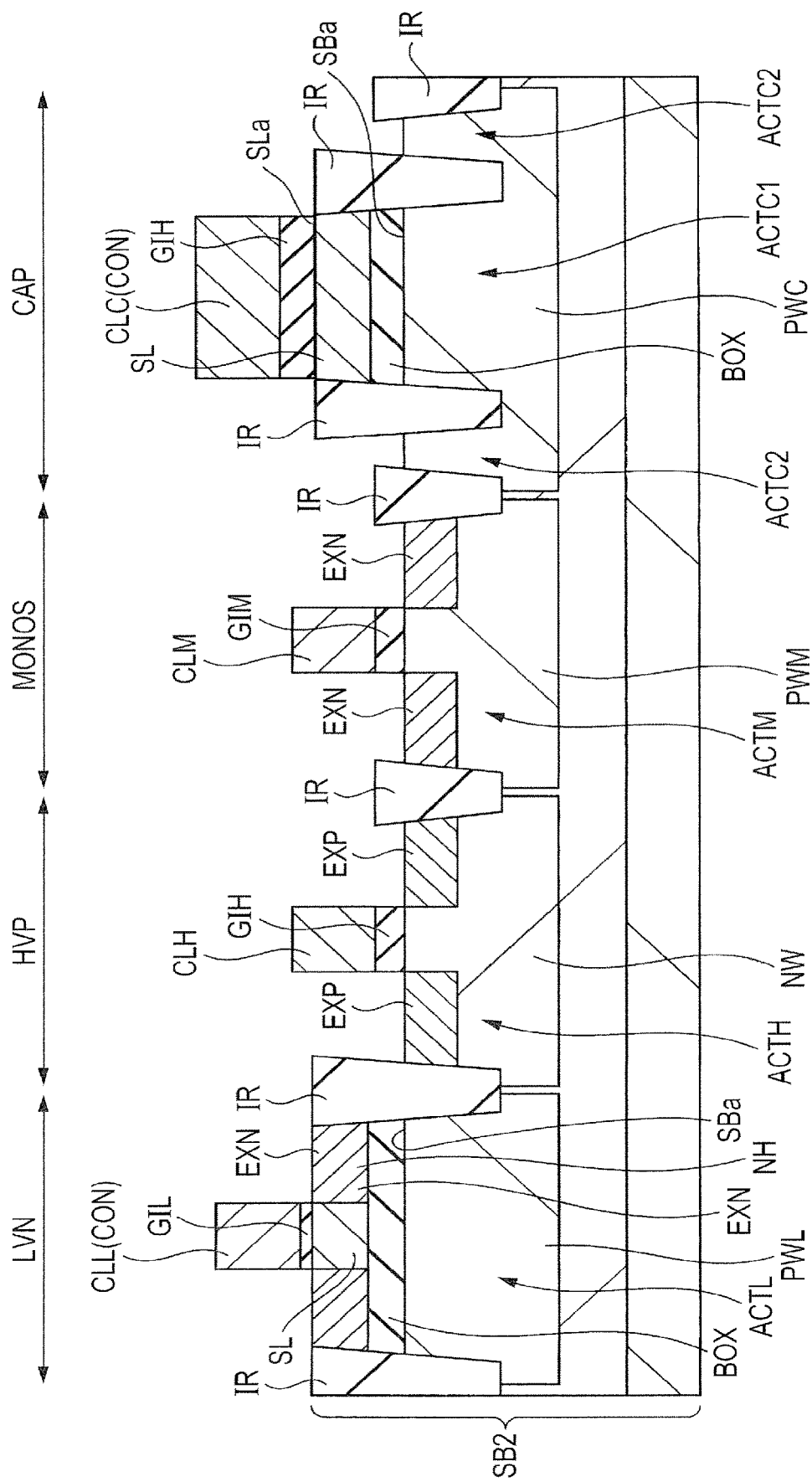
FIG. 13 is a sectional view of the main part during a manufacturing step of the semiconductor device according to the embodiment.

Next, an n-type semiconductor region (n-type low-concentration semiconductor region) EXN is formed in each of the region (active region ACTM) where the nonvolatile memory cell MONOS is to be formed and the region (active region ACTL) where the low breakdown voltage MISFET (LVN) is to be formed, and a p-type semiconductor region (p-type low-concentration semiconductor region) EXP is formed in the region (active region ACTH) where the high breakdown voltage MISFET (HVP) is to be formed, as illustrated in FIG. 13.

In the region where the nonvolatile memory cell MONOS is to be formed, a pair of the n-type semiconductor regions EXN are formed in the semiconductor substrate SB (in other words, the p-type well region PWM) on both sides of the conductor layer CLM that is a gate electrode so as to sandwich the conductor layer CLM. In the region where the low breakdown voltage MISFET (LVN) is to be formed, a pair of the n-type semiconductor regions EXN are formed in the semiconductor layer SL on both sides of the conductor layer CLL that is a gate electrode so as to sandwich the conductor layer CLL. In the region where the high breakdown voltage MISFET (HVP) is to be formed, a pair of the p-type semiconductor regions EXP are formed in the semiconductor substrate SB (in other words, the n-type well region NW) on both sides of the conductor layer CLH that is a gate electrode so as to sandwich the conductor layer CLH.

The n-type semiconductor region EXN is formed by ion implanting n-type impurities, such as phosphorus (P) or arsenic (As), into the semiconductor substrate SB or the semiconductor layer SL, while the p-type semiconductor region EXP is formed by ion implanting p-type impurities, such as boron (B), into the semiconductor substrate SB. The ion implantation for forming the n-type semiconductor region EXN in the region where the nonvolatile memory cell MONOS is to be formed, and the ion implantation for forming the n-type semiconductor region EXN in the region where the low breakdown voltage MISFET (LVN) is to be formed, may or may not be performed in the same step. When they are performed in different steps, the impurity concentrations of the n-type semiconductor regions EXN may be different from each other.

Figure 14:
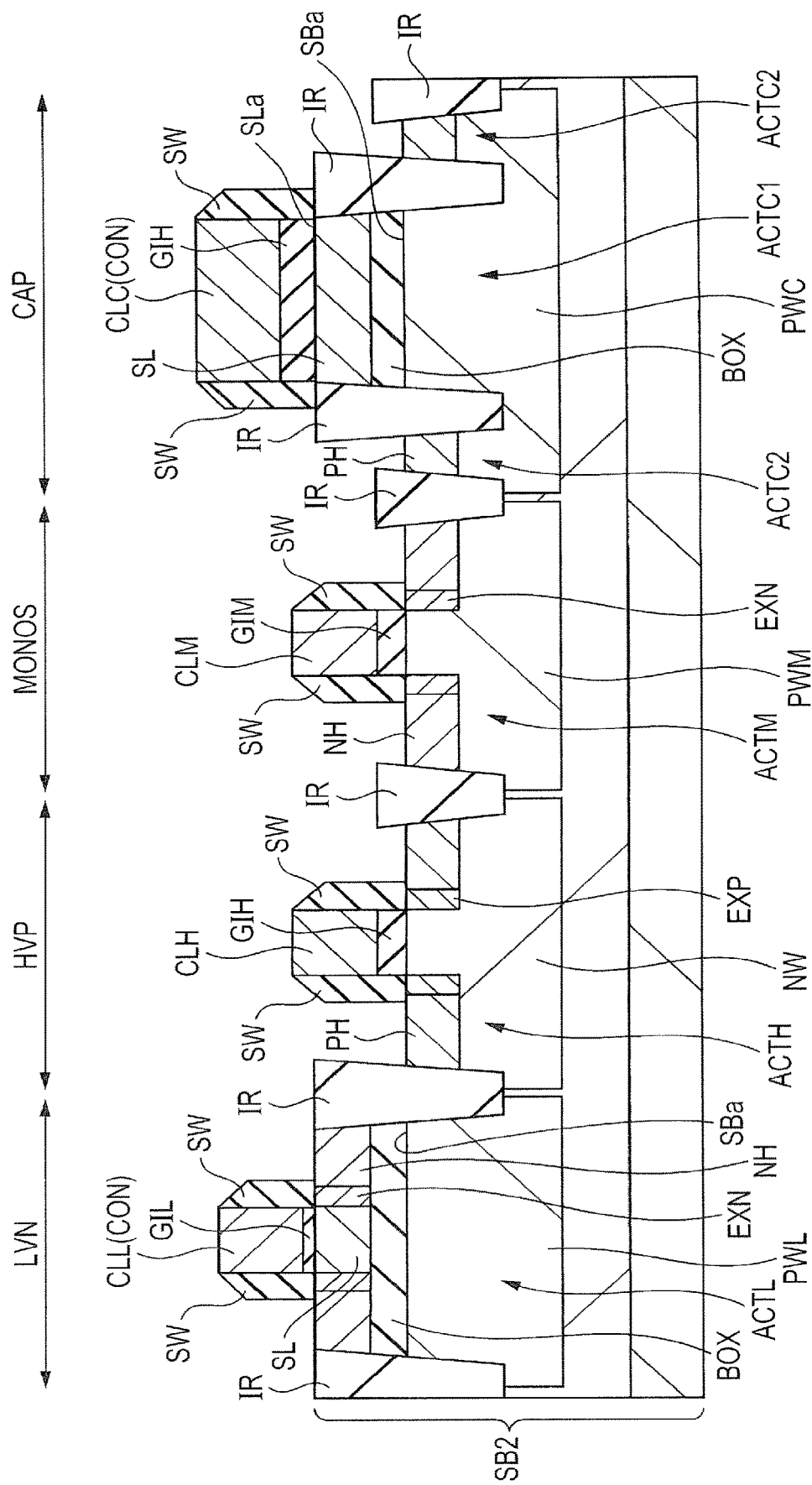
FIG. 14 is a sectional view of the main part during a manufacturing step of the semiconductor device according to the embodiment.

Next, the sidewall insulating layer (sidewall spacer) SW is formed over the side walls of the conductor layer CLC and the insulating film GIH in the region where the capacitive element CAP is to be formed, as illustrated in FIG. 14. The sidewall insulating film SW is formed by depositing an insulating film for forming the sidewall insulating film SW over the substrate SB2 and by subjecting the insulating film to anisotropic dry etching. As the insulating film, a silicon oxide layer, a silicon nitride layer, a laminated film of a silicon oxide layer and a silicon nitride layer, or the like can be used. Similarly, the sidewall insulating film SW is formed over the side walls of the conductor layer CLM and the insulating film GIM in the region where the nonvolatile memory cell MONOS is to be formed, over the side walls of the conductor layer CLH and the insulating film GIH in the region where the high breakdown voltage MISFET (HVP) is to be formed, and over the side walls of the conductor layer CLL and the insulating film GIL in the region where the low breakdown voltage MISFET (LVN) is to be formed.

Further, the n-type semiconductor region (n-type high-concentration semiconductor region) NH is formed in each of the region (active region ACTM) where the nonvolatile memory cell MONOS is to be formed and the region (active region ACTL) where the low breakdown voltage MISFET (LVN) is to be formed, and the p-type semiconductor region (p-type high-concentration semiconductor region) PH is formed in each of the region (active region ACTH) where the high breakdown voltage MISFET (HVP) is to be formed and the active region ACTC2 of the region where the capacitive element CAP is to be formed, as illustrated in FIG. 14. The n-type semiconductor region NH is formed by ion implanting n-type impurities, such as phosphorus (P) or arsenic (As), into the semiconductor substrate SB or the semiconductor layer SL, while the p-type semiconductor region PH is formed by ion implanting p-type impurities, such as boron (B), into the semiconductor substrate SB.

In the region where the nonvolatile memory cell MONOS is to be formed, a pair of the n-type semiconductor regions NH are formed in the semiconductor substrate SB (in other words, the p-type well region PWM) on both sides of the conductor layer CLM that is a gate electrode and the sidewall insulating film SW so as to sandwich the conductor layer CLM and the sidewall insulating film SW. In the region where the low breakdown voltage MISFET (LVN) is to be formed, a pair of the n-type semiconductor regions NH are formed in the semiconductor layer SL on both sides of the conductor layer CLL that is a gate electrode and the sidewall insulating film SW so as to sandwich the conductor layer CLL and the sidewall insulating film SW. In the region where the high breakdown voltage MISFET (HVP) is to be formed, a pair of the p-type semiconductor regions PH are formed in the semiconductor substrate SB (in other words, the n-type well region NW) on both sides of the conductor layer CLH that is a gate electrode and the sidewall insulating film SW so as to sandwich the conductor layer CLH and the sidewall insulating film SW. In the active region ACTC2 of the region where the capacitive element CAP is to be formed, the p-type semiconductor region (p-type high-concentration semiconductor region) PH is formed in the semiconductor substrate SB (in other words, the p-type well region PWC).

Figure 15:
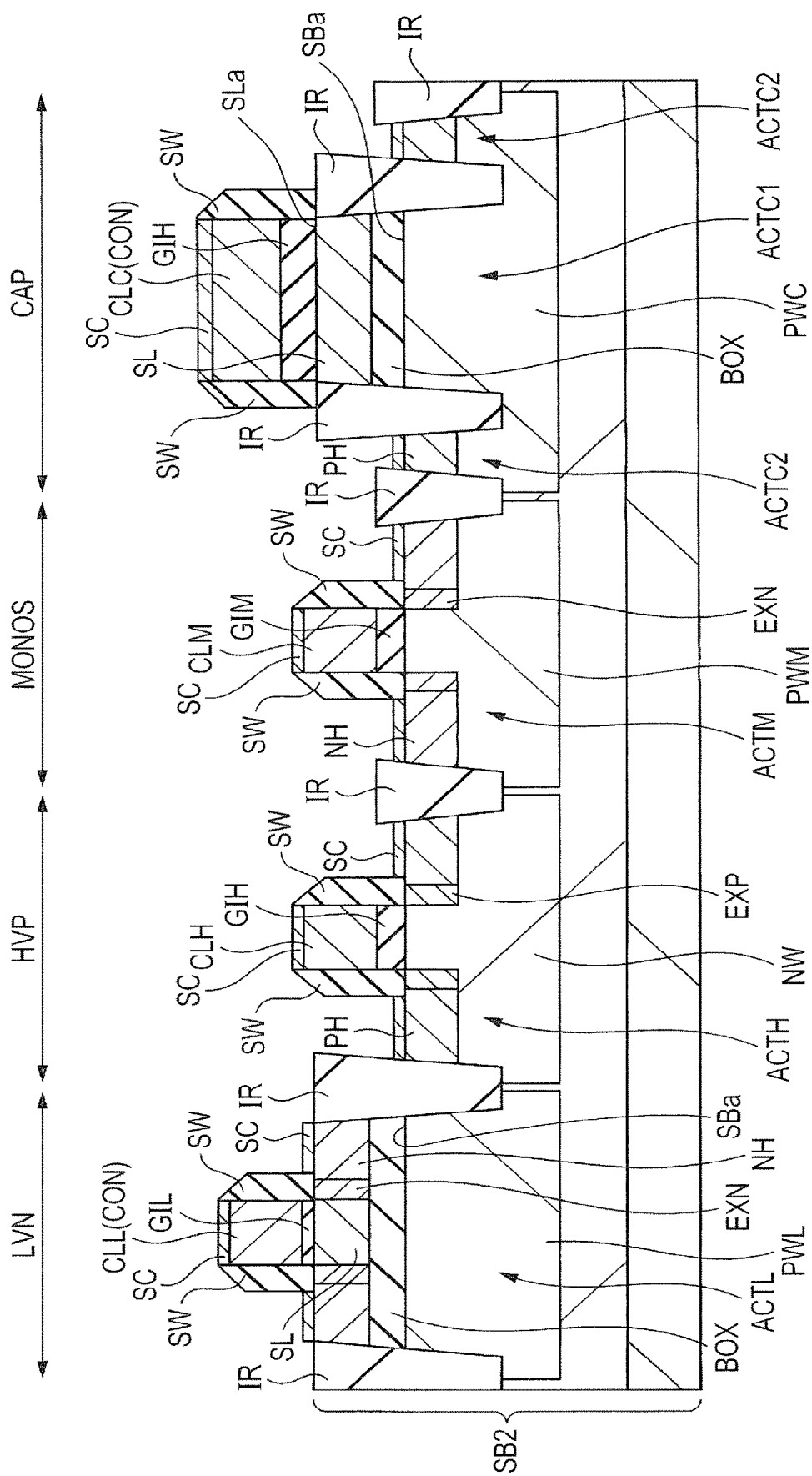
FIG. 15 is a sectional view of the main part during a manufacturing step of the semiconductor device according to the embodiment.

Next, the silicide layer (metal silicide layer) SC is formed over the surfaces of the conductor layers CLC, CLM, CLH, and CLL, the n-type semiconductor region NH, and the p-type semiconductor region PH, as illustrated in FIG. 15. The silicide layer SC includes, for example, cobalt silicide (CoSi), nickel silicide (NiSi), or nickel platinum silicide (NiPtSi).

Figure 16:
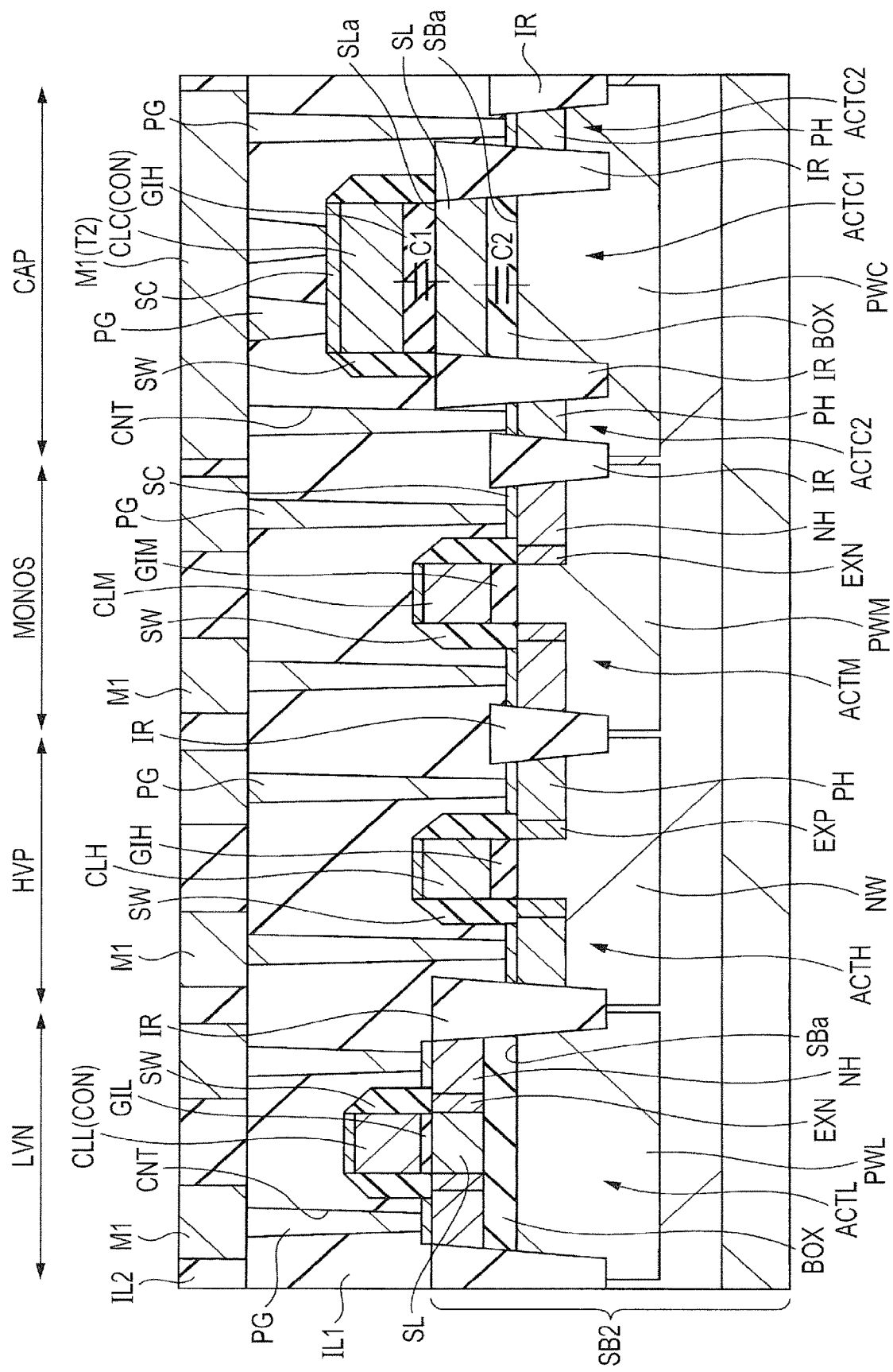
FIG. 16 is a sectional view of the main part during a manufacturing step of the semiconductor device according to the embodiment.

Next, an interlayer insulating layer IL1 is formed over the substrate SB 2, as illustrated in FIG. 16. The interlayer insulating layer IL1 is formed to cover the conductor layers CLC, CLM, CLH, and CLL, the sidewall insulating film SW, and the like. As the interlayer insulating layer IL1, a silicon oxide layer or a laminated film of a silicon nitride layer and a silicon oxide layer located thereover can be used.

Next, a plurality of contact holes (openings) CNT are provided in the interlayer insulating layer IL, so that the plug electrode PG is formed in the contact hole CNT. In the region where the capacitive element CAP is to be formed, the contact hole CNT partially exposes the silicide layer SC formed over the surface of the conductor layer CLC and that formed over the surface of the p-type semiconductor region PH. In addition, the contact hole CNT partially exposes the silicide layer SC formed over the surface of the p-type semiconductor region PH formed in the semiconductor layer SL, as can be seen from FIG. 5. In the regions where the nonvolatile memory cell MONOS is to be formed and where the low breakdown voltage MISFET (LVN) is to be formed, the silicide layer SC over the surface of the n-type semiconductor region NH is partially exposed. In the region where the high breakdown voltage MISFET (HVP) is to be formed, the silicide layer SC over the surface of the p-type semiconductor region PH is partially exposed.

Next, the plug electrode PG is formed in the contact hole CNT. The plug electrode PG is a conductive member including tungsten (W), and specifically it is comprised of a laminated film of a barrier conductor layer of titanium nitride (TiN) or the like and a tungsten layer located thereover.

Next, an interlayer insulating layer IL2 is formed over the interlayer insulating layer IL1 in which the plug electrode PG is buried. Then, a wiring groove is formed in the interlayer insulating layer IL2, and thereafter the wiring (metal wiring) Ml is formed in the wiring groove. The interlayer insulating layer IL2 includes, for example, a silicon oxide layer. The wiring Ml is, for example, a copper wiring containing copper as a main component.

In the region where the capacitive element CAP is to be formed, the conductor layer CLC and the p-type semiconductor region PH are coupled to the wiring Ml via the silicide layer SC and the plug electrode PG, as illustrated in FIG. 16. In the regions where the nonvolatile memory cell MONOS is to be formed and where the low breakdown voltage MISFET (LVN) is to be formed, the n-type semiconductor region NH is coupled to the wiring Ml via the silicide layer SC and the plug electrode PG. In the region where the high breakdown voltage MISFET (HVP) is to be formed, the p-type semiconductor region PH is coupled to the wiring Ml via the silicide layer SC and the plug electrode PG.

Thereafter, the wirings in the second or subsequent layers are formed by a dual damascene process or the like, but illustration and description thereof are omitted herein.

In this way, a semiconductor device according to the present embodiment is manufactured.

As illustrated in FIG. 16, the low breakdown voltage MISFET (LVN) is a MISFET formed in the semiconductor layer SL arranged over the main surface SBa of the semiconductor substrate SB and via the insulating layer BOX, and is referred to as an SOTB (Silicon On Thin Buried oxide) transistor. This low breakdown voltage MISFET (LVN) supplies a desired potential to the p-type well region PWL (referred to as a "back gate") formed in the main surface SBa of the semiconductor substrate SB via the thin insulating layer BOX, and has the characteristic that a leakage current in the low breakdown voltage MISFET (LVN) can be reduced. The high breakdown voltage MISFET (HVP) and the nonvolatile memory cell MONOS are formed in the semiconductor substrate SB, not in the semiconductor layer SL, because high voltage is required for the operation thereof.

The capacitive element CAP has a structure in which the capacitive elements C1 and C2 are stacked together, and the capacitive element C2 is comprised of the p-type well region PWC that is one electrode, the insulating layer BOX that is a dielectric layer, and the semiconductor layer SL that is the other electrode. The capacitive element C1 is comprised of the semiconductor layer SL that is one electrode, the insulating layer GIH that is a dielectric layer, and the conductor layer CLC that is the other electrode, and is formed above the capacitive element C2.

That is, the other electrode (conductor layer CLC) of the capacitive element C1 is formed by using the conductor layer CON that is the same as the conductor layer CLL that is the gate electrode of the low breakdown voltage MISFET (LVN); the dielectric layer (insulating layer GIH) is formed by using the insulating layer GIH that is the gate insulating layer of the high breakdown voltage MISFET (HVP); and the one electrode (semiconductor layer SL) is formed by using the semiconductor layer SL that is the channel layer of the low breakdown voltage MISFET (LVN). Further, the dielectric layer (insulating layer BOX) of the capacitive element C2 is formed by using the above-mentioned thin insulating layer BOX, and the one electrode (p-type well region PWC) is formed by using the p-type well region PWL ("back gate") of the low breakdown voltage MISFET (LVN). That is, the capacitive element CAP having a stacked structure is formed by using the manufacturing steps for both the low breakdown voltage MISFET (LVN) that is an SOTB transistor and the high breakdown voltage MISFET (HVP). That is, the capacitive element CAP can be formed without an increase in the number of the manufacturing steps.

In the above embodiment, the capacitive element C1 is comprised of the p-type semiconductor layer SL, the insulating layer GIH, and the p-type conductor layer CLC, while the capacitive element C2 is comprised of the p-type well region PWC, the insulating layer BOX, and the p-type semiconductor layer SL. As a variation, the capacitive element C1 may be comprised of the n-type semiconductor layer SL, the insulating layer GIH, and the n-type conductor layer CLC, while the capacitive element C2 may be comprised of the n-type well region, the insulating layer BOX, and the n-type semiconductor layer SL.

<First Variation>

Figure 19:
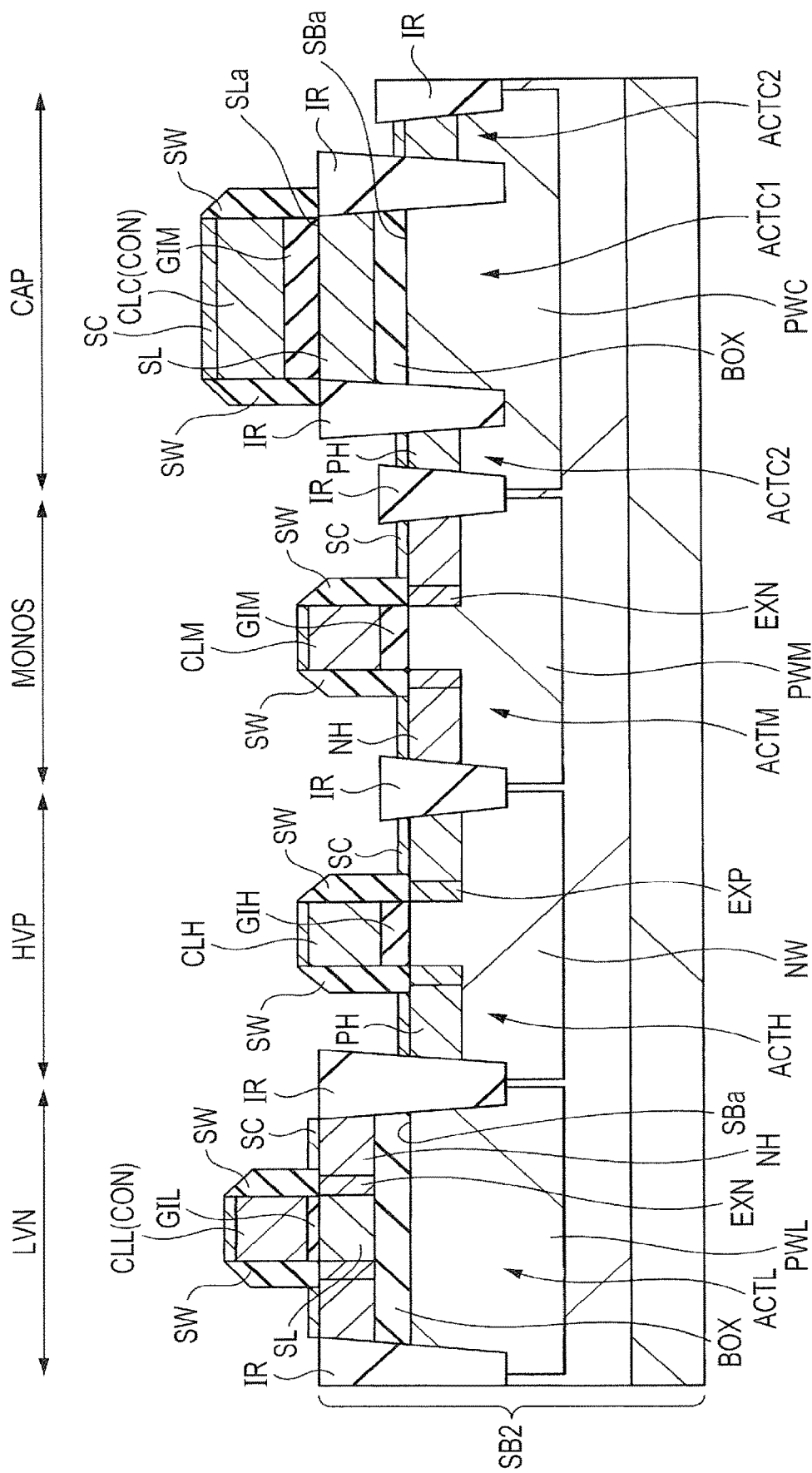
FIG. 19 is a sectional view of a main part illustrating a configuration of a semiconductor device according to First Variation.

FIG. 19 is a sectional view of a main part illustrating the configuration of a semiconductor device according to First Variation. In the above embodiment, the dielectric layer of the capacitive element C1 is formed of the insulating layer GIH that is the gate insulating layer of the high breakdown voltage MISFET (HVP), but in First Variation it is formed of the insulating layer GIM that is the gate insulating layer of the nonvolatile memory cell MONOS. Since the insulating layer GIM includes a silicon nitride layer having a relative permittivity higher than that of a silicon oxide layer, the capacitance value of the capacitive element C1 can be increased.

<Second Variation>

Figure 20:
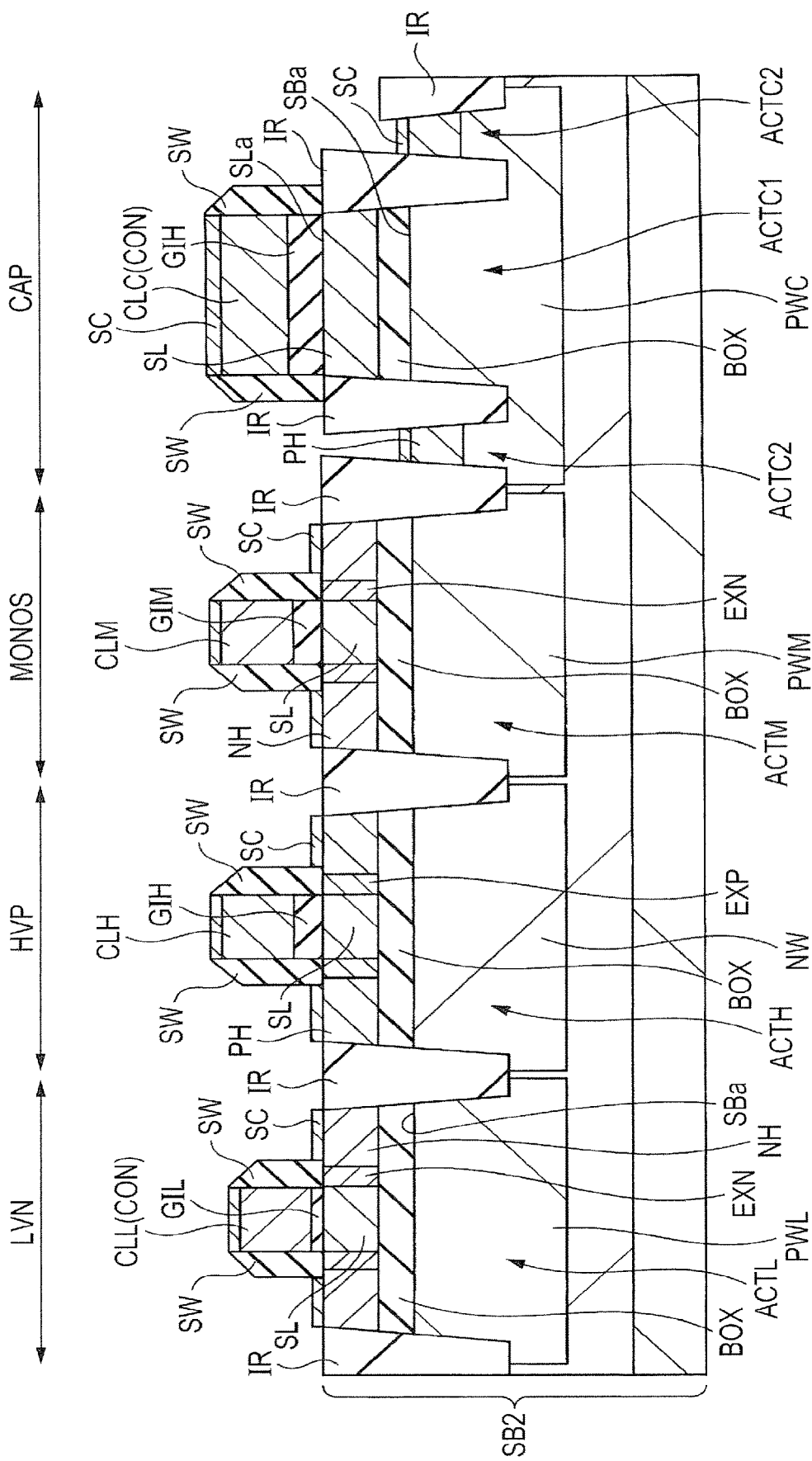
FIG. 20 is a sectional view of a main part illustrating a configuration of a semiconductor device according to Second Variation.

FIG. 20 is a sectional view of a main part illustrating the configuration of a semiconductor device according to Second Variation. In the above embodiment, the nonvolatile memory cell MONOS and the high breakdown voltage MISFET (HVP) are formed in the semiconductor substrate SB, but in Second Variation they are formed in the semiconductor layer SL over the insulating layer BOX. The conductor layer CLM, which is the gate electrode of the nonvolatile memory cell MONOS, is formed over the semiconductor layer SL and via the insulating layer GIM that is a gate insulating layer, and the n-type semiconductor regions EXN and NH, which are respectively a source region and a drain region, are formed in the semiconductor layer SL. Similarly, the conductor layer CLH, which is the gate electrode of the high breakdown voltage MISFET (HVP), is formed over the semiconductor layer SL and via the insulating layer GIH that is a gate insulating layer, and the p-type semiconductor regions EXP and PH, which are respectively a source region and a drain region, are formed in the semiconductor layer SL.

The invention made by the present inventors has been specifically described above based on preferred embodiments, but it is needless to say that the invention should not be limited to the preferred embodiments and various modifications may be made to the invention within a range not departing from the gist of the invention.

What is claimed is:

1. A manufacturing method of a semiconductor device having a first capacitive element and a second capacitive element, comprising the steps of:
    (a) providing a substrate having a semiconductor substrate, a first insulating layer formed over the semiconductor substrate, and a semiconductor layer formed over the first insulating layer;
    (b) forming a first active region and a second active region that are surrounded in plan view by a second insulating layer that penetrates through the semiconductor layer and the first insulating layer to reach the semiconductor substrate;
    (c) forming a semiconductor region in the semiconductor substrate so as to include the first active region and the second active region;
    (d) removing the semiconductor layer and the first insulating layer in the second active region; and
    (e) in the first active region, forming a first conductor layer over the semiconductor layer via a third insulating layer,
    wherein the first capacitive element is comprised of the semiconductor layer, the third insulating layer, and the first conductor layer,
    wherein the second capacitive element is comprised of the semiconductor region, the first insulating layer, and the semiconductor layer, and
    wherein each of the semiconductor substrate and the semiconductor layer includes a single crystal silicon layer.

2. The manufacturing method of a semiconductor device according to claim 1,
    wherein in the step (e), a first region covered with the first conductor layer and a second region exposed from the first conductor layer are formed, in plan view, in the semiconductor layer in the first active region,
    the manufacturing method further comprising the step of:
    (f) forming a first wiring to be coupled to the first conductor layer and the semiconductor region and in the second region a second wiring to be coupled to the semiconductor layer.

3. A manufacturing method of a semiconductor device comprising the steps of:
    (a) providing a substrate having a semiconductor substrate, a first insulating layer formed over the semiconductor substrate, and a semiconductor layer formed over the first insulating layer, and further having, in a main surface of the semiconductor substrate, a first region where a first capacitive element and a second capacitive element are to be formed, a second region where a first MISFET is to be formed, and a third region where a second MISFET is to be formed;
    (b) removing the semiconductor layer and the first insulating layer in the third region;
    (c) forming a semiconductor region in the semiconductor substrate in the first region;
    (d) forming a second insulating layer over the semiconductor layer in the first region and over the semiconductor substrate in the third region;
    (e) forming a third insulating layer having a smaller thickness than the second insulating layer over the semiconductor layer in the second region;
    (f) forming a first conductor layer over the second insulating layer in the first region, a second conductor layer over the third insulating layer in the second region, and a third conductor layer over the second insulating layer in the third region, respectively;
    (g) in the second region, forming a second semiconductor region in the semiconductor layer at both ends of the second conductor layer; and
    (h) in the third region, forming a third semiconductor region in the semiconductor substrate at both ends of the third conductor layer,
    wherein in the first region, the first capacitive element is comprised of the semiconductor layer, the second insulating layer, and the first conductor layer,
    wherein in the first region, the second capacitive element is comprised of the semiconductor region, the first insulating layer, and the semiconductor layer, and
    wherein each of the semiconductor substrate and the semiconductor layer includes a single crystal silicon layer.

4. The manufacturing method of a semiconductor device according to claim 3,
    wherein the first insulating layer includes a first silicon oxide layer.

5. The manufacturing method of a semiconductor device according to claim 3,
    wherein the second insulating layer includes a second silicon oxide layer.

6. The manufacturing method of a semiconductor device according to claim 3,
    wherein the second insulating layer includes a first silicon nitride layer.

7. The manufacturing method of a semiconductor device according to claim 3,
    wherein the second insulating layer includes a laminated structure of a third silicon oxide layer, a second silicon nitride layer, and a fourth silicon oxide layer.

* * * * *